(12) United States Patent
Yang et al.

(10) Patent No.: US 12,740,350 B2
(45) Date of Patent: Sep. 15, 2026

(54) SUBSTRATE PROCESSING METHOD

(71) Applicant: ASM IP Holding B.V., Almere (NL)

(72) Inventors: Jihye Yang, Ansan-si (KR); Hongsuk Kim, Yongin-si (KR); JuHyuk Park, Hwaseong-si (KR); SungHa Choi, Suwon-si (KR); SangHeon Yong, Yongin-si (KR); KiHun Kim, Yongin-si (KR)

(73) Assignee: ASM IP Holding B.V., Almere (NL)

( * ) Notice: Subject to any disclaimer, the term of this patent is extended or adjusted under 35 U.S.C. 154(b) by 546 days.

(21) Appl. No.: 18/199,092

(22) Filed: May 18, 2023

(65) Prior Publication Data

US 2024/0258101 A1 Aug. 1, 2024

Related U.S. Application Data

(60) Provisional application No. 63/441,508, filed on Jan. 27, 2023, provisional application No. 63/441,519, filed on Jan. 27, 2023.

(51) Int. Cl.

| | |
|---|---|
| ***H10P 14/60*** | (2026.01) |
| ***H10P 14/692*** | (2026.01) |
| ***H10P 14/694*** | (2026.01) |
| ***H10W 70/69*** | (2026.01) |

(52) U.S. Cl.
CPC ...... *H10P 14/6308* (2026.01); *H10P 14/6336* (2026.01); *H10P 14/6339* (2026.01); *H10P 14/6546* (2026.01); *H10P 14/6682* (2026.01); *H10P 14/6687* (2026.01); *H10P 14/69215* (2026.01); *H10P 14/69433* (2026.01); *H10W 70/69* (2026.01)

(58) Field of Classification Search
CPC ......... H01L 21/02236; H01L 21/02164; H01L 21/0217; H01L 21/02211; H01L 21/02219; H01P 14/6308; H01P 14/6687; H01P 14/69433; H01P 14/6336; H01P 14/6546; H01P 14/6339; H01P 14/6682; H01P 14/69215
See application file for complete search history.

(56) References Cited

U.S. PATENT DOCUMENTS

| | | | | |
|---|---|---|---|---|
| 2014/0302689 A1* | 10/2014 | Ashtiani | ............ | H10P 14/6336 438/786 |
| 2017/0186642 A1* | 6/2017 | Kim | .................. | H10W 10/0143 |
| 2019/0301014 A1* | 10/2019 | Pierreux | ............ | C23C 16/4405 |

(Continued)

OTHER PUBLICATIONS

Raider, S.I., et al., "Surface Oxidation of Silicon Nitride Films". Journal of The Electrochemical Society, 123, 560-565.*

(Continued)

*Primary Examiner* — Bret P Chen
(74) *Attorney, Agent, or Firm* — Snell & Wilmer L.L.P.

(57) ABSTRACT

A substrate processing method comprising providing a substrate having a gap in a surface thereof into a reaction space, partially filling each of the plurality of gaps with a flowable silicon nitride film, forming a silicon oxide film partially filled in the gap by converting the silicon nitride film into the silicon oxide film, fully filling the gap, which is partially filled with the silicon oxide film, with a silicon nitride film, and forming a silicon oxide film to be fully filled in the gap, by converting the silicon nitride film into the silicon oxide film is provided.

23 Claims, 23 Drawing Sheets

100

PROVIDE SUBSTRATE HAVING GAP IN REACTION SPACE — 110
FILL GAP WITH FLOWABLE SILICON NITRIDE FILM — 120
CONVERT FLOWABLE SILICON NITRIDE FILM INTO SILICON OXIDE FILM — 130
PERFORM POST-TREATMENT ON SILICON OXIDE FILM — 140

(56) References Cited

U.S. PATENT DOCUMENTS

| | | | | |
|---|---|---|---|---|
| 2019/0304821 | A1* | 10/2019 | Pierreux | H01L 21/67063 |
| 2020/0140995 | A1* | 5/2020 | Blanquart | H01L 21/02532 |
| 2020/0243323 | A1* | 7/2020 | Kalutarage | C23C 16/505 |

OTHER PUBLICATIONS

Franz, I, et al., "Conversion of Silicon Nitride Into Silicon Dioxide Through the Influence of Oxygen". Solid-State Electronics, 197, vol. 14, pp. 499-505.*

Raider, S.I., et al., "Surface Oxidation of Silicon Nitride Films". J. Electrochem. Soc. 123 (1976) 560-565.*

Riley, Frank L., "Silicon Nitride and Related Materials". J. Am. Ceram. Soc., 83 [2] 245-265 (2000).*

* cited by examiner

A

MICROPORES
(WHITE SPOTS)
3'
DELAMINATION
(WHITE SPACE)
1
200nm

B

As dep + Conversion 12min (As dep + Conversion 4min) x 3cycle

A

B

SUBSTRATE PROCESSING METHOD

CROSS-REFERENCE TO RELATED APPLICATIONS

This application claims priority to U.S. Provisional Patent Application Ser. No. 63/441,508 filed Jan. 27, 2023 titled SUBSTRATE PROCESSING METHOD and U.S. Provisional Patent Application Ser. No. 63/441,519 filed Jan. 27, 2023 titled SUBSTRATE PROCESSING METHOD, the disclosures of which are hereby incorporated by reference in their entirety.

BACKGROUND

1. Field

The disclosure relates to a substrate processing method, and more particularly, to a substrate processing method wherein a silicon oxide film is formed in a gap structure formed in various shapes on a surface of a substrate.

2. Description of the Related Art

A gap-fill process, which is a technology widely used in a semiconductor manufacturing process, refers to a process of filling a gap in a pattern structure, for example, shallow trench isolation (STI), with an insulating material and the like. As the degree of integration of semiconductor devices increases, the aspect ratio (A/R) of a gap in a pattern structure rapidly increases as well. Accordingly, the rapid filling of a gap having a high A/R with a gap filling material without generating a void, a seam, a micropore and/or a delamination has been demanded. To meet such a demand, a flowable chemical vapor deposition (FCVD) technology has been used.

In a process of forming a silicon oxide film in a gap of a substrate using the FCVD technology, in a deposition step, a film having a flowable SiN:H component is filled in the gap, and the component is converted into a $SiO_2$ component. However, when a gap is filled with a silicon oxide film through a general FCVD technology, the conversion into a silicon oxide film is not made uniformly and densely in a lower region of the gap compared with an upper region of the gap.

Accordingly, regarding filling a gap of a substrate with a silicon oxide film, there is a demand for a substrate processing method to stably form a uniform and dense silicon oxide film in the lower region of the gap by eliminating or suppressing a void, a seam, a micropore and/or a delamination.

SUMMARY

Provided is a substrate processing method by which, in a gap-fill process, a gap may be filled with a silicon oxide film with improved density.

Provided is a substrate processing method by which, in a gap-fill process, a gap may be filled with a silicon oxide film with improved uniformity.

Additional aspects will be set forth in part in the description which follows and, in part, will be apparent from the description, or may be learned by practice of the presented embodiments.

According to an aspect of the disclosure, a substrate processing method includes providing, in a reaction space, a substrate having a gap in a surface thereof, partially filling each of the plurality of gaps with a flowable silicon nitride film, forming a silicon oxide film partially filled in the gap by converting the silicon nitride film into the silicon oxide film, fully filling the gap, which is partially filled with the silicon oxide film, with a silicon nitride film, and forming a silicon oxide film to be fully filled in the gap, by converting the silicon nitride film into the silicon oxide film.

In some embodiments, the fully filling of the gap with a flowable silicon nitride film may be controlled such that a maximum thickness T1 of the silicon nitride film formed on a top portion of a convex between the gap and an adjacent gap is 25% or less of a maximum thickness T2 of the silicon nitride film filling the gap.

In some embodiments, the substrate processing method may further include forming an additional silicon oxide film over the entire surface of the silicon oxide film. In some embodiments, the step of forming the additional silicon oxide film is performed by a chemical vapor deposition (CVD) process or an atomic layer deposition (ALD) process.

In some embodiments, the substrate processing method may further include performing a post-treatment of densifying the silicon oxide film that is fully filled in the gap.

In some embodiments, in the partially filling of the gap with the silicon nitride film, the gap may be filled up to half of a depth of the gap. In some embodiments, the partially filling of the gap with the flowable silicon nitride film and the forming of the silicon oxide film partially filled in the gap by converting the silicon nitride film into the silicon oxide film may each be performed multiple times.

In some embodiments, when the thickness at which the conversion into a silicon oxide film from a surface of a silicon nitride film is saturated over a process time is defined as a saturation thickness, the thickness of the silicon nitride film that is partially filled in the gap may be within the saturation thickness.

In some embodiments, the partially or fully filling of the gap with the silicon nitride film may be performed by supplying a silicon precursor and a nitrogen reactant gas into the reaction space and maintaining the reaction space in a plasma atmosphere, and in some embodiments, the silicon precursor may include at least one of silicon containing precursors, such as at least one of silicon-containing precursors such as silicon-containing oligomers, aminosilanes, iodosilanes, silicon hydrohalides, and silicon halides. For example, silicon-containing precursors include at least one selected from trisilylamine (TSA), $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; and $SiH_2I_2$.

When the molecular structure of the supplied silicon precursor is too simple, for example, a monomer or a single molecule, the vapor pressure is high and the silicon source volatilizes easily and loses fluidity. On the other hand, when the molecular structure of the silicon precursor is complex and the molecular weight is high and the vapor pressure is low, the flowability of the silicon precursor is too slow, and thus, the efficiency is lowered in a process requiring an appropriate level of fluidity. For example, when a flowable film is used to fill a gap, voids may occur in the gap if the flowable silicon nitride film has insufficient fluidity. Accordingly, the silicon precursor used in some of the embodiments is an oligomeric silicon source having a molecular structure that is not too simple or too complex, for example, a molecular structure having from about 2 to about 10 monomer units. Examples of the silicone-containing oligomer include, but are not limited to, dimer-trisilylamine, trimer-trisilylamine, tetramer-trisilylamine, pentamer-trisilylamine, hexamer-trisilylamine, heptamer-trisilylamine, and octamer-trisilylamine, and any mixtures thereof. In some embodiments, the nitrogen reactant gas may include at least one selected from among $NH_3$, $N_2$, $N_2O$, $NO_2$, $N_2H_2$, $N_2H_4$, and any mixtures thereof.

In some embodiments, the converting of the silicon nitride film into the silicon oxide film may be performed by flowing an oxygen-containing gas in the reaction space, and for example, a gas containing ozone ($O_3$) or an oxygen radical may be used as the oxygen-containing gas. In some embodiments, the converting of the silicon nitride film into the silicon oxide film is performed in the reaction space that is in a non-plasma atmosphere.

In some embodiments, the partially filling of the gap with the silicon nitride film and the fully filling of the gap with a silicon nitride film, may be performed under the same process condition. In some embodiments, the forming of the silicon oxide film partially filled in the gap by converting the silicon nitride film into the silicon oxide film and the forming of the silicon oxide film fully filled in the gap by converting the silicon nitride film into the silicon oxide film may be performed under the same process condition.

In some embodiments, a ratio between a process time of the partially filling of the gap with the silicon nitride film and a process time of the forming of the silicon oxide film partially filled in the gap by converting the silicon nitride film into the silicon oxide film may be within a range of about 1:1 to about 1:20.

According to another aspect of the disclosure, a substrate processing method including providing, in a reaction space, a substrate having a gap in a surface thereof, performing a first deposition step of depositing in the gap with a flowable silicon nitride film, performing a first conversion step of converting the silicon nitride film deposited in the gap into a silicon oxide film, performing a second deposition step of depositing a flowable silicon nitride film on the silicon oxide film filling the gap, and performing a second conversion step of converting the silicon nitride film in the gap into a silicon oxide film.

In some embodiments, the second deposition step is controlled such that a maximum thickness T1 of the silicon nitride film formed on a top portion of a convex between the gap and an adjacent gap is 25% or less of a maximum thickness T2 of the silicon nitride film filling the gap.

In some embodiments, the substrate processing method may further include forming an additional silicon oxide film over the entire surface of the silicon oxide film. In some embodiments, the step of forming the additional silicon oxide film is performed by a chemical vapor deposition (CVD) process or an atomic layer deposition (ALD) process.

In some embodiments, the substrate processing method may include, after the second conversion step, performing a post-treatment of densifying the silicon oxide film. In some embodiments, the first deposition step and the first conversion step may each be performed twice or more; or a preset process time.

In some embodiments, when the thickness at which the conversion into a silicon oxide film from the surface of the silicon nitride film is saturated over the process time is defined as a saturation thickness, the target thickness may be the saturation thickness.

In some embodiments, the first deposition step and the second deposition step may each be performed by supplying a silicon precursor and a nitrogen reactant gas into the reaction space and maintaining the reaction space in a plasma atmosphere. In some embodiments, the first conversion step and the second conversion step may each be performed in a non-plasma atmosphere by flowing an oxygen containing gas in the reaction space.

In some embodiments, a ratio between the process time of the first deposition step: the process time of the first conversion step may be within about 1:1 to about 1:20.

According to another aspect of the disclosure, provided is a substrate structure in which the silicon oxide film converted from the silicon nitride film is filled in the gap formed in the surface of the substrate, according to the substrate processing method according to an embodiment of the disclosure.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
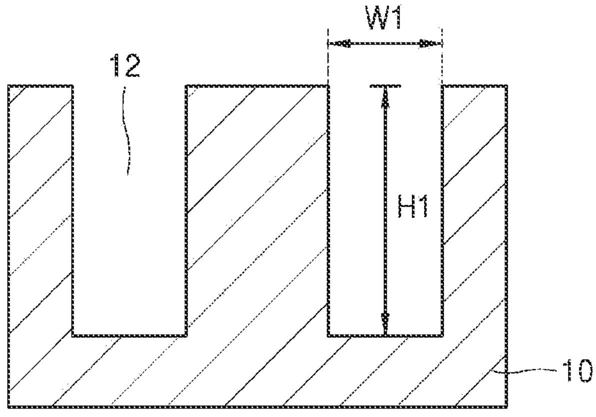
FIGS. 1A to 1E are conceptual cross-sectional views showing a general process of filling a gap with a silicon oxide film.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Embodiments are provided to further completely explain the disclosure to one of ordinary skill in the art to which the disclosure pertains.

However, the disclosure is not limited thereto and it will be understood that various changes in form and details may be made therein without departing from the spirit and scope of the following claims. That is, descriptions on particular structures or functions may be presented merely for explaining embodiments of the disclosure.

Terms used in the specification are used for explaining a specific embodiment, not for limiting the disclosure. Thus, the expression of singularity in the specification includes the expression of plurality unless clearly specified otherwise in context. Also, terms such as "comprise" and/or "comprising" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof. As used in the specification, the term "and/or" includes any one of listed items and all of at least one combination of the items.

In the specification, terms such as "first" and "second" are used herein merely to describe a variety of members, parts, areas, layers, and/or portions, but the constituent elements are not limited by the terms. It is obvious that the members, parts, areas, layers, and/or portions are not limited by the terms. The terms are used only for the purpose of distinguishing one constituent element from another constituent element. Thus, without departing from the right scope of the disclosure, a first member, part, area, layer, or portion may refer to a second member, part, area, layer, or portion.

Hereinafter, the embodiments of the disclosure are described in detail with reference to the accompanying drawings. In the drawings, the illustrated shapes may be modified according to, for example, manufacturing technology and/or tolerance. Thus, the embodiment of the disclosure may not be construed to be limited to a particular shape of a part described in the specification and may include a change in the shape generated during manufacturing, for example.

First, a substrate processing method of performing a gap-fill process by filling a gap in a substrate with a flowable film, for example, a silicon nitride film, according to a general flowable chemical vapor deposition method (FCVD), and converting the flowable film into a silicon oxide film, is described.

FIGS. 1A to 1E are conceptual cross-sectional views showing a general process of filling a gap with a silicon oxide film.

Referring to FIG. 1A, a substrate 10 is provided in a reaction space (not shown) in which a gap-fill process is to be performed. Provided is a gap structure including a plurality of gaps 12, each having a specific vertical depth H1 in a vertical direction and a specific horizontal width W1 in a horizontal direction, in some area of a surface of the substrate 10. In FIG. 1A, for example, the gaps 12 formed in the surface of the substrate 10 have the same width W1 in the horizontal direction and the same depth H1 in the vertical direction.

Figure 1B:
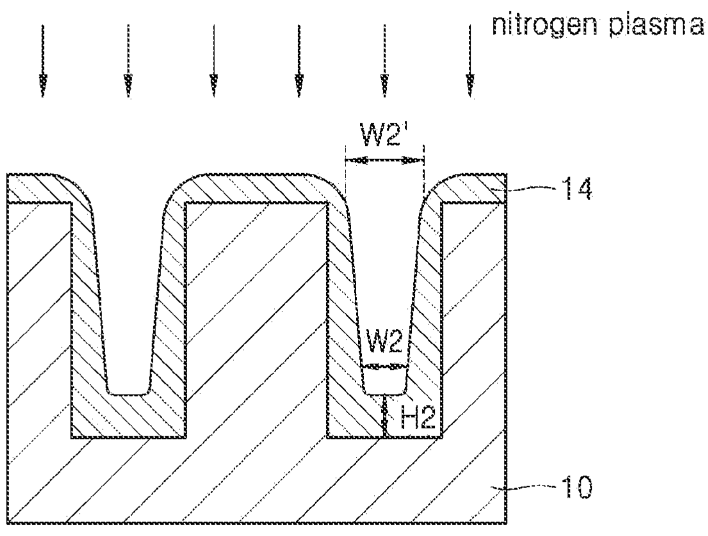

Referring to FIG. 1B, when RF power is applied while supplying a silicon precursor and a nitrogen reactant gas into the reaction space, the reaction space is in a plasma atmosphere, and under the plasma atmosphere, through a condensation reaction, an oligomerization reaction, a polymerization reaction, and the like between the silicon precursor and the nitrogen reactant gas, a silicon nitride film 14 having flowability is deposited on an exposed surface of the substrate 10 including the gaps 12. Due to the flowability of the silicon nitride film 14, the silicon nitride film 14 flows from an upper region to a lower region of each of the gaps 12, and thus, the width of an inner space between the silicon nitride films 14 facing each other in the gap 12 is formed such that a width W2' in the upper region of the gap 12 is less than a width W2 in the lower region thereof.

Figure 1C:
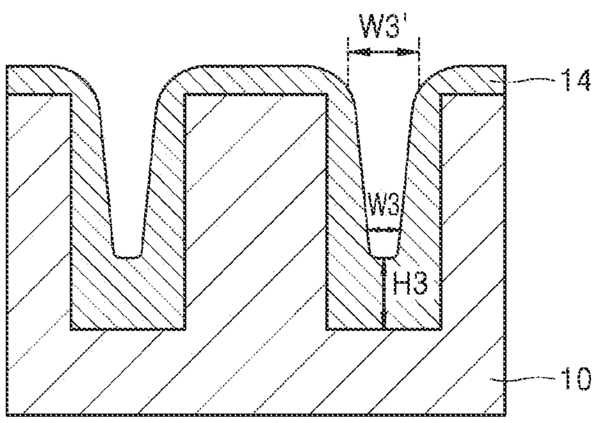

Referring to FIG. 1C, as the gap-fill process proceeds further, the silicon nitride film 14 is deposed by flowing from the upper region to the lower region of the gap 12, the width of the inner space between the silicon nitride films 14 formed in the gap 12 is formed such that the width W3 in the lower region thereof decreases further than a width W3' in the upper region of the gap 12, and the height of the silicon nitride film 14 formed from the bottom surface of the gap 12 also increases (H2<H3).

Figure 1D:
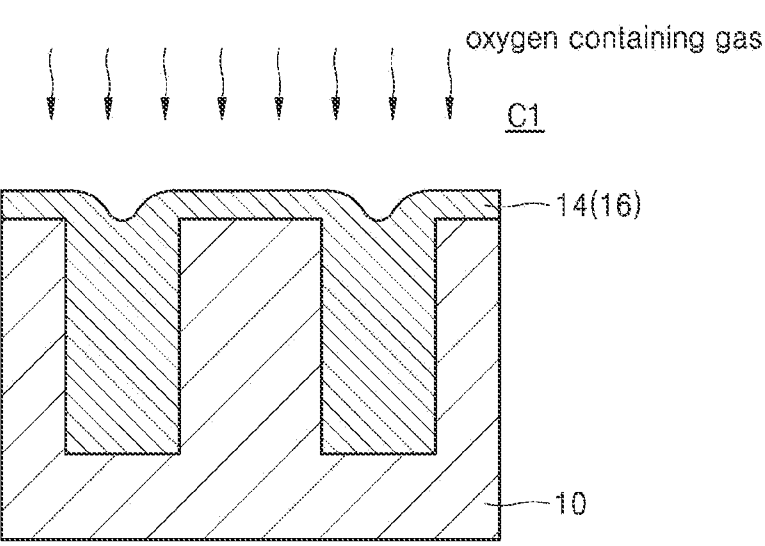

Referring to FIG. 1D, when the gap-fill process proceeds further and a sufficient time has passed, the gap 12 is fully filled with the silicon nitride film 14. Next, as an oxygen containing gas is supplied into the reaction space, the silicon nitride film 14 that fully fills the gap 12 is converted into a silicon oxide film 16.

Figure 1E:
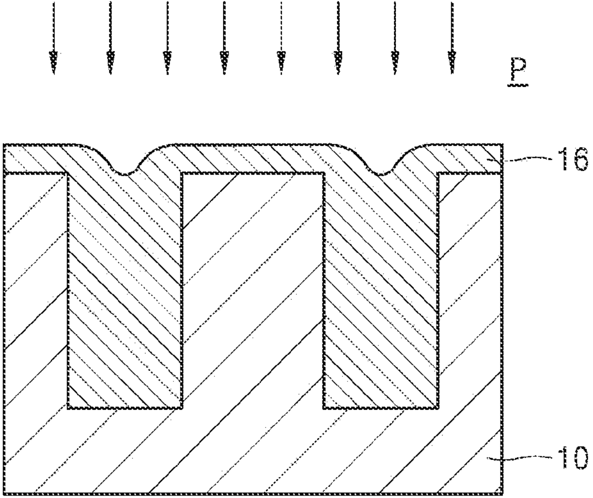

Referring to FIG. 1E, the silicon oxide film 16 is densified by performing a post-treatment process P, for example, a high-temperature heat treatment, on the silicon oxide film 16.

Figure 2:
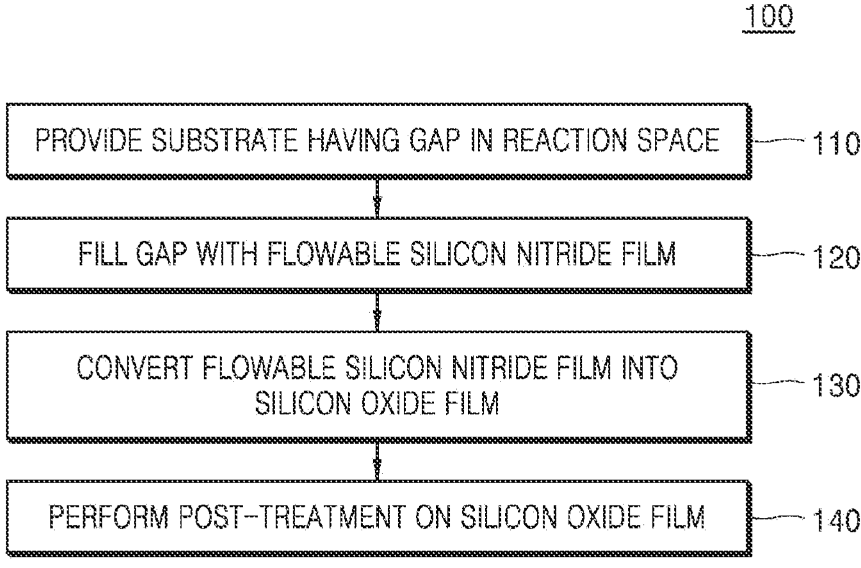
FIG. 2 is a conceptual block diagram showing a general process of filling a gap with a silicon oxide film.

FIG. 2 is a conceptual block diagram showing a general process 100 of filling a gap with a silicon oxide film. FIGS. 1A to 1E illustrate an example of the gap-fill process of a silicon oxide film according to the process sequence of FIG. 2.

Referring to FIG. 2 with FIGS. 1A to 1E together, the substrate 10 is provided into a reaction space (not shown) in which a gap-fill process is to be performed (Operation 110). Next, when RF power is applied while supplying a process gas, such as a silicon precursor, a nitrogen reactant gas, and the like, into the reaction space, the reaction space is in a plasma atmosphere, and the silicon nitride film 14 having flowability is deposited on an exposed surface of a substrate including the gaps 12, through a condensation reaction, an oligomerization reaction, a polymerization reaction, and the like between the silicon precursor and the nitrogen reactant gas, and as a deposition process continues, the silicon nitride film 14 fully fills up to an upper portion of each of the gaps 12 (Operation 120).

Next, by supplying an oxygen containing gas into the reaction space, the silicon nitride film 14 filled in the gap 12 is converted into the silicon oxide film 16 (Operation 130). Next, a post-treatment process is performed for the densification of a film on the silicon oxide film 16 (Operation 140).

Figure 3:
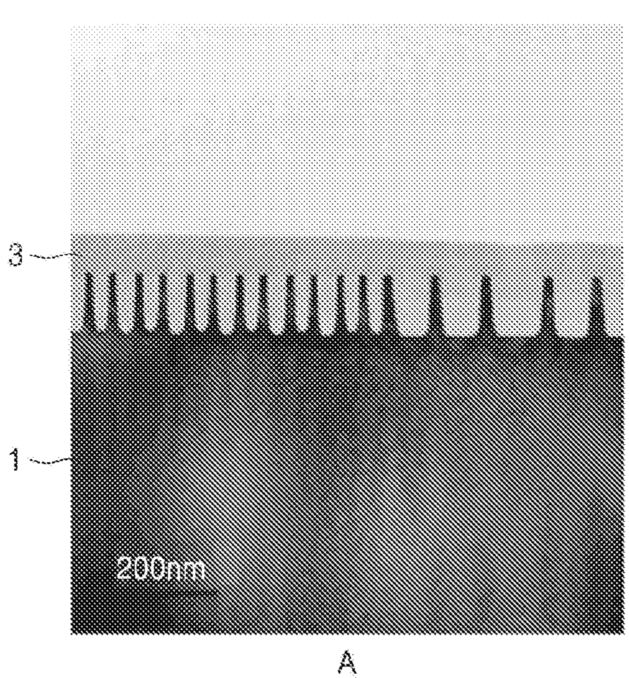
FIG. 3 shows a cross-sectional image taken by transmission electron microscopy showing a state in which micropores are generated in a silicon oxide film filling a gap and the silicon oxide film is delaminated from a substrate, which occur in a general process of filling a gap with a silicon oxide film.

FIG. 3 shows a cross-sectional image taken by transmission electron microscopy showing a state in which micropores are generated in a silicon oxide film filling a gap and the silicon oxide film is delaminated from a substrate, which occur in a general process 100 of filling a gap with a silicon oxide film. Referring to image (A) of FIG. 3, on a substrate 1 in which gaps are formed in a surface thereof, a silicon nitride film 3 is deposited to a certain thickness or more to fill the gaps and cover the entire surface of the substrate 1 by a plasma enhanced FCVD process. Image (B) of FIG. 3 shows a state in which a silicon nitride film 3 is converted into a silicon oxide film 3' by a conversion process. Referring to image (B) of FIG. 3, it can be seen that micropores in the form of white fine spots are formed in the silicon oxide film 3' filling in the gaps. In addition, the presence of many portions in which the silicon oxide film 3' filling the gaps is delaminated from the substrate 1 can be confirmed from the presence of many white space between the substrate 1 and the silicon oxide film 3'.

As the degree of integration of a semiconductor device increases, the aspect ratio (A/R) of a gap also increases significantly, and when a silicon oxide film fills the gap, the conversion of a silicon oxide film is not made uniformly and densely in a lower region of the gap compared with an upper region of the gap, and thus, a substrate processing method of stably forming a uniform and dense silicon oxide film in the lower region of the gap is required.

FIGS. 4A to 4E are conceptual cross-sectional views showing a process of filling a gap with a silicon oxide film, according to an embodiment of the disclosure.

Figure 4A:
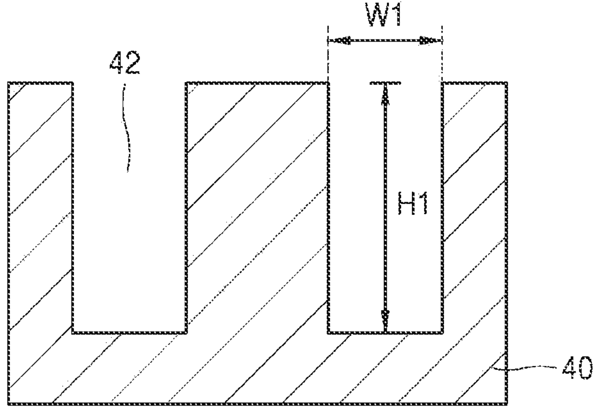
FIGS. 4A to 4E are conceptual cross-sectional views showing a process of filling a gap with a silicon oxide film, according to an embodiment of the disclosure.

Referring to FIG. 4A, a substrate 40 is provided into a reaction space (not shown) in which a gap-fill process is performed. Provided is a gap structure including a plurality of gaps 42 having the specific vertical depth H1 in the vertical direction and the specific horizontal width W1 in the horizontal direction, in some area of a surface of the substrate 40. In FIG. 4A, for example, the gaps 42 formed in the surface of the substrate 40 have the same width W1 in the horizontal direction and the same depth H1 in the vertical direction.

The substrate 40 may include a semiconductor material, such as Si or Ge, or various compound semiconductor materials, such as SiGe, SiC, GaAs, InAs, or InP, and may also include various substrates, such as a silicon on insulator (SOI), a silicon on sapphire (SOS), and the like, used in a semiconductor device, a display device, and the like. In other words, the substrate 40 to which the disclosure may be applied may include all substrates in which a gap-fill process is to be performed as various pattern structures are formed on a surface thereof.

The gaps 42 are formed in the surface of the substrate 40. The gaps 42 used in the disclosure refer to one of the pattern structures in the broadest sense. Each of the gaps 42 may refer to a certain space having at least an upper side exposed by neighboring pattern structures that define the gap 42. For example, the gap 42, as a device isolation region for defining an active area in a semiconductor manufacturing process, may be not only shallow trench isolation (STI), but also recess areas of various geometric shapes formed in the surface of the substrate 40.

Furthermore, the gap 42 may be in the form of a via that penetrates a conductive layer located between insulating layers, or an insulating layer located between conductive layers. Furthermore, the gaps 42 may be gaps in the form in which a part of a specific material layer (not shown) of a single layer or multilayer formed on the surface of the substrate 40 is etched and removed. The material layer may include, for example, a conductive material, an insulating material, a semiconductor material, or the like. Furthermore, although the gap 42 may have a cylindrical shape, the cross-sectional shape of the gap 42 may have not only a circular shape, but also various polygonal shapes, such as an oval shape, a triangular shape, a rectangular shape, a pentagonal shape, and the like. Furthermore, although the gap 42 may have a shape of an island having various cross-sectional shapes, the gap 42 may have a line shape on the substrate 40. Furthermore, although the gap 42 may have a vertical profile with approximately the same width from the upper region that is an entrance area of the gap 42 to the lower region, the gap 42 may have a non-vertical profile with a horizontal width that increases or decreases linearly or step by step from the upper region to the lower region of the gap 42.

Although FIG. 4A illustrates a case in which the gaps 42 are formed in the substrate 40, in the specification, the substrate may merely refer to the substrate 40 only, or substrates having various geometric surface structures before the gap filling material according to the disclosure is formed thereon. Alternatively, the gaps 42 may be a structure formed by removing a part of a specific film (not shown) deposited on the substrate 40.

Figure 4B:
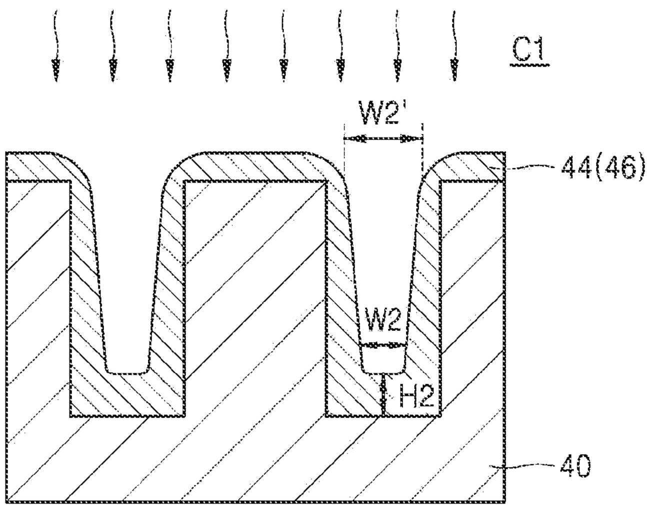

Referring to FIG. 4B, by proceeding a gap-fill process, a silicon nitride film 44 having flowability is deposited on the exposed surface of the substrate 40 illustrated in FIG. 4A to partially fill each of the gaps 42. In detail, when RF power is applied while supplying a silicon precursor and a nitrogen reactant gas into the reaction space, the reaction space is in a plasma atmosphere, and the silicon nitride film 44 having flowability is deposited on the exposed surface of the substrate 40 including the gaps 42, through a condensation reaction, an oligomerization reaction, and a polymerization reaction, and the like between the silicon precursor and the nitrogen reactant gas. Due to the flowability, the silicon nitride film 44 flows along the side walls of the gap 42 from the upper region to the lower region of the gap 42 to fill the gap upwards from the bottom surface of the gap 42. Accordingly, the width of the inner space between the silicon nitride films 44 facing each other in the gap 42 is formed such that a width W2 in the lower region of the gap 42 is less than a width W2' in the upper region of the gap 42.

In detail, the silicon nitride film 44 formed on the substrate 40 has flowability, and furthermore, a flowing direction of the silicon nitride film 44 may be closely related to a direction of a force applied to the silicon nitride film 44. For example, when gravity acts on the silicon nitride film 44, the flowing direction of the silicon nitride film 44 is a direction in which gravity acts, and thus, when the surface of the substrate 40 is a convex surface, the silicon nitride film 44 may be formed by flowing from a convex portion toward a peripheral portion thereof. In contrast, when the surface of the substrate 40 is a concave surface recessed from a horizontal surface, the silicon nitride film 44 having flowability may be formed by flowing toward a concave portion, for example, the bottom of the gap 42.

Referring to FIG. 4B again, by supplying a silicon precursor and a nitrogen reactant gas into a reaction space into which the substrate 40 is provided, and maintaining the reaction space in a plasma atmosphere, the silicon nitride film 44 having flowability is deposited on the exposed surface of the substrate 40 to partially fill the gap 42, for example, through a plasma enhanced chemical vapor deposition (PECVD) process.

For example, as the silicon precursor to be supplied, a silicon-containing precursor (silicon source) capable of providing, to the film, a silicon component constituting the film to be formed may be used. Silicon precursors that can be used according to the disclosure may be, are not limited to, at least one of silicon-containing precursors such as silicon-containing oligomers, aminosilanes, iodosilanes, silicon hydrohalides, and silicon halides. For example, silicon-containing precursors include at least one selected from trisilylamine (TSA), $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; and $SiH_2I_2$.

When the molecular structure of the supplied silicon source is too simple, for example, a monomer or a single molecule, the vapor pressure is high and the silicon source volatilizes easily and loses fluidity. On the other hand, when the molecular structure of the silicon source is complex and the molecular weight is high and the vapor pressure is low, the flowability of the silicon source is too slow, and thus, the efficiency is lowered in a process requiring an appropriate level of fluidity. For example, when a flowable silicon nitride film is used to fill a gap, voids may occur in the gap if the flowable film has insufficient fluidity. Accordingly, the silicon precursor used in some embodiments of the disclosure is an oligomeric silicon source having a molecular structure that is not too simple or too complex, for example, a molecular structure having from about 2 to about 10 monomer units. Examples of the silicone-containing oligomer include, but are not limited to, dimer-trisilylamine dimer (dimer-TSA), trimer-trisilylamine, tetramer-trisilylamine, pentamer-trisilylamine, hexamer-trisilylamine, heptamer-trisilylamine, octamer-trisilylamine, and the like.

In some embodiments, each of these silicone-containing oligomers may be supplied alone to the reaction space, for example, dimer-TSA may be supplied alone to the reaction space, and in other embodiments, trimer-TSA may be supplied alone. Also, in some embodiments, two or more silicon precursor sources may be supplied to the reaction space together. For example, in some embodiments, dimer-TSA and trimer-TSA may be simultaneously supplied as a silicon precursor source, and in some embodiments, trimer-TSA and tetramer-TSA may be simultaneously supplied as a silicon precursor source. In some embodiments, dimer-TSA, trimer-TSA and tetramer-TSA may be simultaneously supplied as a silicon precursor source.

Formula 1 represents the molecular structure of dimer-TSA in which two monomer-TSAs are bonded, and Formula 2 represents the molecular structure of trimer-TSA in which three monomer-TSAs are bonded or one monomer-TSA and one dimer-TSA are bonded.

(1)

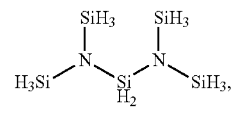

(2)

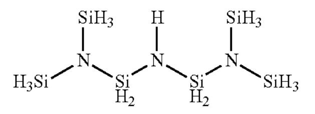

As the nitrogen reactant gas, for example, a nitrogen-containing gas capable of providing a nitrogen component for forming the silicon nitride film 44 may be used. The nitrogen-containing gas may include, but is not limited thereto, at least one selected from $NH_3$, $N_2$, $N_2O$, $NO_2$, $N_2H_2$, $N_2H_4$, and any mixtures thereof. In an embodiment, $NH_3$ gas may be used as the nitrogen reactant gas. The nitrogen reactant gas may be supplied into the reaction space within a range of more than 0 sccm to several thousand sccm, for example, about 1 sccm to about 2,500 sccm.

The nitrogen reactant may promote a condensation reaction and a formation of cross-linking bonds during oligomerization of the silicon precursor. Accordingly, the bonding structure of the silicon nitride film formed thereby may be in a more complete form. When a silicon nitride film is formed on a substrate having a gap structure by supplying only a silicon precursor source without the supply of a nitrogen reactant, for example, without the supply of $NH_3$ plasma, it may be difficult to fill the gaps with the silicon nitride film without voids.

The silicon precursor and the nitrogen reactant gas may be supplied into the reaction space together with argon gas as a carrier gas. To make the silicon precursor, oligomers, and the like have an appropriate level of fluidity, the temperature of the substrate in the reaction space may be maintained at a relatively low temperature range, for example, about 0° C. to about 150° C., for example, about 20° C. to about 130° C., about 30° C. to about 120° C., or about 40° C. to about 100° C. The temperature of the substrate may be controlled by directly controlling the temperature of a heating block on which the substrate is mounted, by controlling the temperature of the atmosphere in the reaction space, or by controlling the temperature of the container of the silicon precursor source. For example, the temperature of a container for silicon precursor may be maintained in the temperature range of, for example, about 0° C. to about 150° C., for example, about 20° C. to about 130° C., about 30° C. to about 120° C., or about 40° C. to about 100° C. To make the inside of the reaction space to be in a plasma atmosphere, relatively low RF power, for example, the RF power of greater than 0 W to about 500 W, about 100 W to about 500 W, for example, from about 100 W to about 400 W, 100 W to about 300 W, or about 40 W to about 100 W, may be applied. In this state, an RF frequency used may be from about 10 MHz to about 60 MHz, for example, about 13.56 MHz to about 60 MHZ, or about 20 MHz to about 30 MHz. The pressure in the reaction space in the process of depositing the silicon nitride film 44 may be maintained in a range of about 0.5 Torr to about 50.0 Tor, for example, from about 1.0 Torr to about 9.0 Torr, or from about 2.0 Torr to about 6.0 Torr. Furthermore, in order to generate a plasma atmosphere in the reaction space, according to some embodiments of the disclosure, an in-situ plasma treatment device that directly generates plasma on the substrate 40 by applying RF power directly to a reaction chamber while supplying the silicon precursor and the nitrogen reactant gas together into the reaction space may be used, or a remote plasma processing device may be used.

Next, referring to FIG. 4B, a conversion step of converting the silicon nitride film 44 partially filled in the gap 42 into a silicon oxide film 46 is performed. The conversion step may be performed while flowing an oxygen-containing gas into the reaction space (C1). A gas containing ozone ($O_3$) or an oxygen radical may be used as the oxygen-containing gas. When a gas containing ozone ($O_3$), i.e., an ozone flow ($O_3$ flow) is used, the ozone flow generated by an ozone generator may be introduced into the reaction space. The conversion step of the silicon nitride film 44 into the silicon oxide film 46 may be performed in the reaction space that is in a non-plasma atmosphere. Alternatively, the conversion step may be performed by supplying a remote oxygen plasma to the flowable silicon nitride film 44. The remote oxygen plasma may be formed by applying, in a remote plasma discharge chamber located remote from the reaction space, a RF power greater than 0 W to 5000 W, for example 1000 W to 4000 W, specifically about 2000 W to about 2500 W, and having a frequency of about 10 MHz to about 60 MHz, for example, about 13.56 MHz to about 30 MHz. A remote oxygen plasma may then be introduced into the reaction space through a pipe.

The pressure in the reaction space during the conversion step may be maintained in a range of about 0.5 Torr to about 50.0 Torr, for example, in a range from about 1.0 Torr to about 9.0 Torr, or from about 2.0 Torr to about 3.0 Torr. To effectively convert the flowable silicon nitride film 44 into the silicon oxide film 46, the temperature of the substrate 40 may be maintained within a range of about 0° C. to about 300° C., for example, from about 0° C. to about 150° C., from about 50° C. to about 200° C., from about 50° C. to about 150° C., from about 30° C. to about 70° C., or from about 40° C. to about 100° C.

Figure 4C:
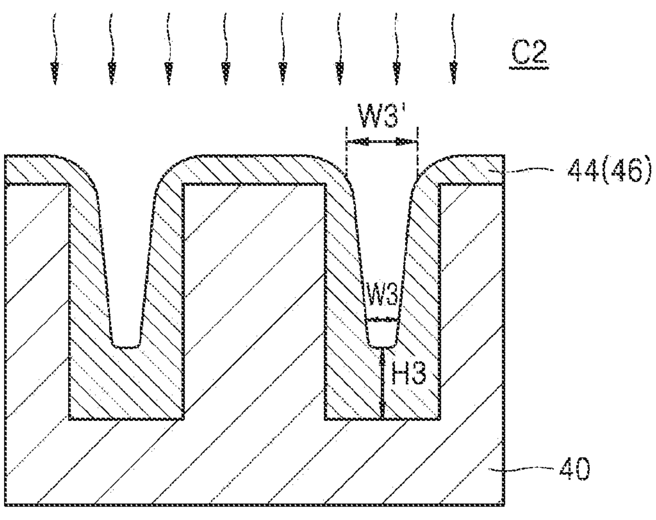

Next, referring to FIG. 4C, by continuously performing the gap-fill process on the exposed surface of the silicon oxide film 46 partially filled in the gap 42 in FIG. 4B, the silicon nitride film 44 having flowability is additionally deposited to partially fill the gap 42. Although the process of depositing the silicon nitride film 44 illustrated in FIG. 4C may be substantially the same as the process of depositing the silicon nitride film 44 illustrated in FIG. 4B, the deposition process of FIG. 4C may be performed by changing some process conditions.

As the gap-fill process of FIG. 4C continues, due to the flowability of the silicon nitride film 44, the silicon nitride film 44 flows along the side walls of the gap 42 from the upper region to the lower region of the gap 42 to fill the gap 42 from the bottom in a bottom-up manner, and thus, the width of the inner space between the silicon nitride films 44 facing each other in the gap 42 is formed such that the width W3 in the lower region thereof is less than the width W3' in the upper region of the gap 42, and that the height of the silicon nitride film 44 formed from the bottom surface of the gap 42 increases (H2<H3).

Referring back to FIG. 4C, a conversion step of converting the silicon nitride film 44 partially filled in the gap 42 into a silicon oxide film is additionally performed. The conversion step may be performed by flowing an oxygen-containing gas in the reaction space (C2). Although the conversion step illustrated in FIG. 4C is substantially the same as the conversion step illustrated in FIG. 4B, the conversion step of FIG. 4C may be performed by changing some process conditions.

Figure 4D:
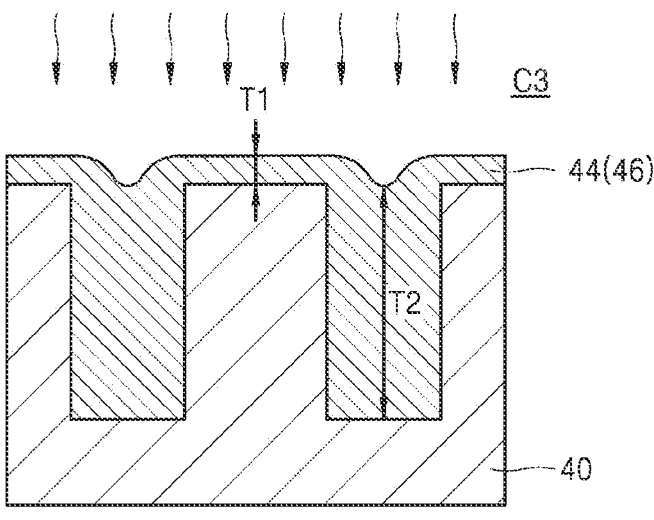

Next, referring to FIG. 4D, by continuously performing the gap-fill process on the exposed surface of the silicon oxide film 46 partially filled in the gap 42 in FIG. 4C, the silicon nitride film 44 having flowability is additionally deposited to fully fill the gap 42. Although the process of depositing the silicon nitride film 44 illustrated in FIG. 4D is substantially the same as the processes of depositing the silicon nitride film 44 illustrated in FIGS. 4B and 4C, the deposition process of FIG. 4D may be performed by changing some process conditions.

In some embodiments, the fully filling of the gap with a flowable silicon nitride film 44 is controlled such that a maximum thickness T1 of the silicon nitride film 44 formed on a top portion of a convex between the gap and an adjacent gap is 25% or less of a maximum thickness T2 of the silicon nitride film 44 filling the gap. For example, the maximum thickness T1 may be 5% or more and 25% or less, 6% or more and 23% or less, 7% or more and 22% or less, 8% or more and 21% or less, 9% or more and 20% or less, 10% or more and 19% or less, 10% or more and 18% or less, 10% or more and 17% or less, 10% or more and 16% or less, 10% or more and 15% or less, 10% or more and 14% or less, 10% or more and 13% or less, or 10% or more 12% or less, of the maximum thickness T2.

Referring back to FIG. 4D, a conversion step of converting the silicon nitride film 44 fully filled in the gap 42 into the silicon oxide film 46 is additionally performed. The conversion step may be performed while flowing an oxygen-containing gas into the reaction space (C3). Although the conversion step of converting into a silicon oxide film 46 illustrated in FIG. 4D is substantially the same as the conversion steps illustrated in FIGS. 4B and 4C, the conversion step of FIG. 4D may be performed by changing some process conditions.

In some embodiments, the substrate processing method may further include forming an additional silicon oxide film (not shown) over the entire surface of the silicon oxide film 46 by perform a chemical vapor deposition (CVD) process or an atomic layer deposition (ALD) process.

Figure 4E:
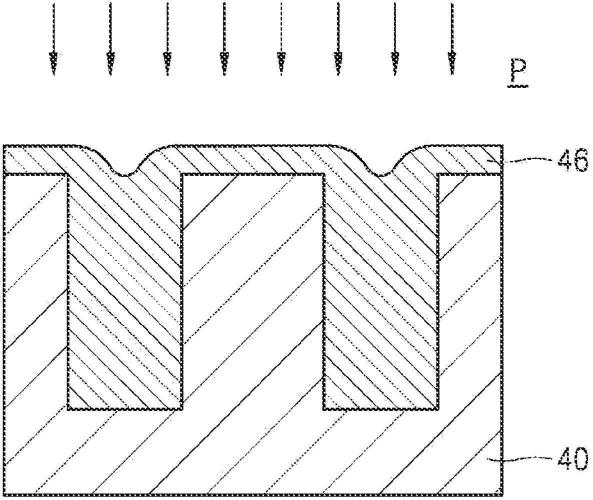

Referring to FIG. 4E, a post-treatment process (P) for densification of a film is performed on the silicon oxide film 46 fully filled in the gap 42. The post-treatment process may be performed by various well-known methods, for example, a high-temperature heat treatment may be performed on the silicon oxide film 46.

Through the post-treatment process (P), the silicon oxide film 46 may be hardened to prevent external impurities such as carbon or nitrogen from penetrating into the silicon oxide film, and may sufficiently act as an etch barrier layer for wet or dry etching, an insulating layer, or a device isolation layer. The post-treatment process (P) may be performed by a thermal treatment such as rapid heat-treatment to the silicon oxide film 46 while supplying an oxygen gas of greater than 0 sccm to about 5000 sccm to form a densified silicon oxide film. The process conditions for the rapid heat treatment may include: a pressure of about 1.0 Torr to about 20.0 Torr, for example, about 2.0 Torr to about 15.0 Torr, for example, about 5.0 Torr to about 10.0 Torr; and a temperature of about 50° C. to about 650° C., for example, about 100° C. to about 600° C., for example, about 300° C. to about 550° C. or about 500° C. to about 550° C.

Through the post-treatment process (P), the surface of the silicon oxide film 46 becomes dense and hard, so that the permeation of external impurities such as carbon or nitrogen into the silicon oxide film may be prevented. In some embodiments, the post-treatment process (P) may be performed by transferring the substrate from the deposition apparatus to a separate apparatus for a thermal treatment. For example, the post-treatment process (P) may be performed in a furnace apparatus or a rapid thermal processing or rapid thermal annealing (RTP or RTA) apparatus or in the same reaction space in which the conversion step of converting the silicon nitride film 44 fully filled in the gap 42 into the silicon oxide film 46 is performed.

Figure 5:
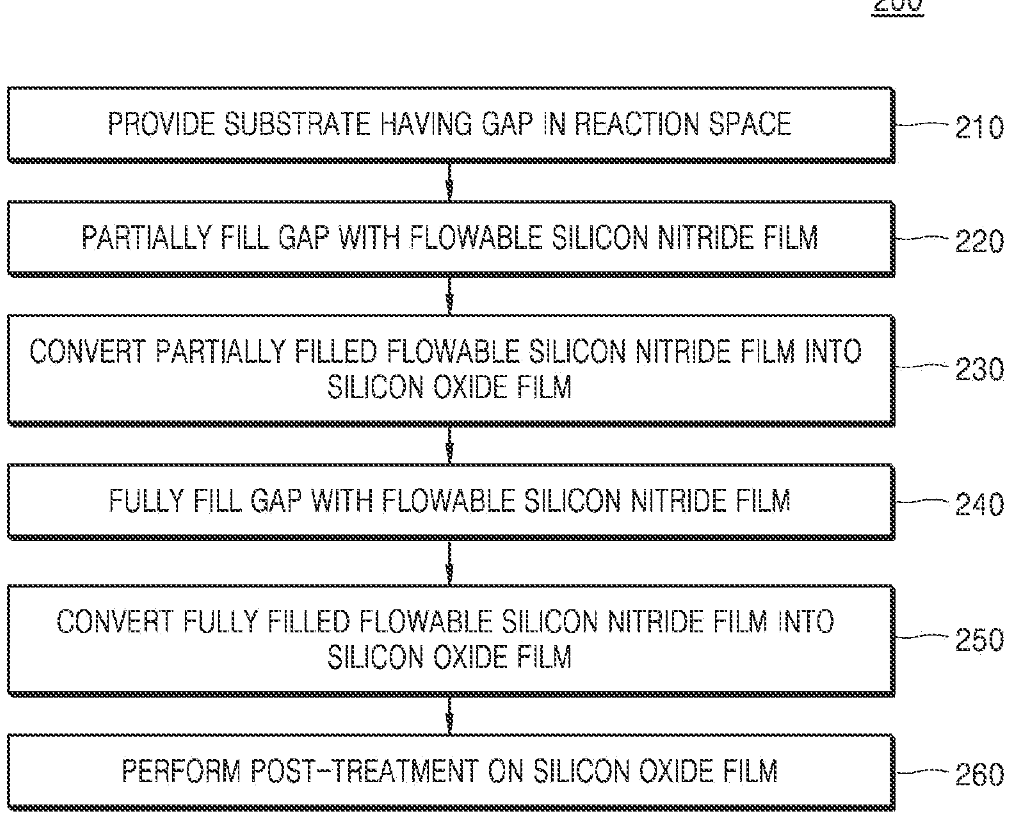
FIG. 5 is a conceptual block diagram showing a process of filling a gap with a silicon oxide film, according to an embodiment of the disclosure.

FIG. 5 is a conceptual block diagram showing a process 200 of filling a gap with a silicon oxide film, according to an embodiment of the disclosure. FIGS. 4A to 4E illustrate an example of the gap-fill process of a silicon oxide film according to the process sequence of FIG. 5.

Referring to FIG. 5 with FIG. 4A together, the substrate 40 is provided into a reaction space in which a gap-fill process is to be performed (Operation 210).

Next, referring to FIG. 5 with FIG. 4B together, the gap 42 formed in the surface of the substrate 40 is partially filled with the silicon nitride film 44 having flowability (Operation 220). In detail, when RF power is applied while supplying a process gas, such as a silicon precursor, a nitrogen reactant gas, and the like, into the reaction space, the reaction space is in a plasma atmosphere, and the silicon nitride film 44 having flowability is deposited on the exposed surface of the substrate 40 including the gaps 42, through a condensation reaction, an oligomerization reaction, and a polymerization reaction, and the like between the silicon precursor and the nitrogen reactant gas. In this state, the gap 42 is partially, not fully filled with the silicon nitride film 44. Next, by stopping the supply of the silicon precursor and the nitrogen reactant gas into the reaction space, and supplying an oxygen containing gas into the reaction space, the silicon nitride film 44 partially filled in the gap 42 is converted into the silicon oxide film 46 (Operation 230).

As the silicon nitride film 44 partially filled in the gap 42 is, as described above, filled in a bottom-up manner from the bottom, that is, the lower region, of the gap 42, due to the flowability of the silicon nitride film 44, the silicon nitride film 44 is preferentially filled in the bottom and side wall of the gap 42, and next, by converting the silicon nitride film 44 partially filled in the lower region of the gap 42 into the silicon oxide film 46, densi-fication and uniformity of the silicon oxide film 46 formed in the lower region of the gap 42 may be improved.

In detail, as shown in FIG. 1D showing the general gap-fill process, when the silicon nitride film 14 fully fills the gap 12 at a time, the conversion to the silicon oxide film 16 does not sufficiently occur in the lower region of the gap 12, and thus, the silicon oxide film 46 formed in the lower region of the gap 12 is insufficiently formed in terms of density and uniformity. In particular, as the aspect ratio of a gap increases in highly-integrated a semiconductor device, it may be more difficult to achieve a required density and uniformity of a silicon oxide film in the lower region of a gap.

Accordingly, without limited to any specific theory, it has been known that there is a limitation in the range of conversion into a silicon oxide film depending on the thickness of a silicon nitride film deposited on a substrate (e.g. the depth from a surface of a silicon nitride film, in detail, a depth from an upper surface of a gap in the case of a silicon nitride film filled in the gap). In other words, it may mean that, while the conversion into a silicon oxide film to a specific depth from the surface of a silicon nitride film is sufficiently made (e.g., saturated) by sufficiently increasing a process time, the conversion into a silicon oxide film may not be sufficiently made at a position deeper than the specific depth even though the process time is increased.

In detail, referring to FIG. 4B, when the process time is increased sufficiently, the conversion of the silicon nitride film 44 into the silicon oxide film 46 may be sufficiently made to a specific thickness or depth from the surface of the silicon nitride film 44 as the silicon nitride film 44 easily contacts the oxygen-containing gas supplied in the conversion step. However, it may mean that, at a position deeper than the specific thickness or depth from the surface of the silicon nitride film 44, the conversion into a silicon oxide film may not be sufficiently made even though the process time is increased. In the specification, a specific thickness at which the conversion into a silicon oxide film from the surface of a silicon nitride film is sufficiently made (that is saturated) as the process time increases is defined as a saturation thickness.

For example, referring to FIG. 4B, the thickness H2 of the silicon nitride film 44 in the lower region of the gap 42 in which the conversion into the silicon oxide film 46 is sufficiently made, is referred to as a saturation thickness. Accordingly, in the process of partially filing a gap with a flowable silicon nitride film in FIG. 5 (Operation 220), the thickness of the silicon nitride film 44 that is partially filled may be set to be the saturation thickness or less. The saturation thickness may vary depending on the process conditions for depositing a silicon nitride film (e.g. a pressure and a temperature in the reaction space, RF power, a type and/or a flow rate of a silicon precursor, a type and/or a flow rate of a nitrogen reactant gas, a process time, and the like), and/or the conversion conditions(e.g. a pressure and a temperature in the reaction space, a type or a flow rate of an oxygen-containing gas, a process time, and the like).

Next, referring to FIG. 4C, the silicon nitride film 44 having flowability is repeatedly and partially filled in the gap 42 on the exposed surface of the silicon oxide film 46 formed in the gap 42 according to Operation 220. In other words, while supplying a process gas, such as a silicon precursor, a nitrogen reactant gas, and the like, into the reaction space in plasma atmosphere, the silicon nitride film 44 having flowability is additionally deposited in the gap 42 that is partially filled with the silicon oxide film 46. In this state, the gap 42 may be filled with the silicon nitride film 44 not fully, but partially, and the process conditions may be the same as the process conditions of FIG. 4B or some of the process conditions may be changed.

Next, the supply of the silicon precursor and the nitrogen reactant gas into reaction space are stopped, and an oxygen-containing gas is supplied into the reaction space, resulting in converting the silicon nitride film 44 that is additionally deposited and partially filled in the gap into the silicon oxide film 46 (Operation 230). In this state, the process conditions may be the same as the process conditions of FIG. 4B, or some of the process conditions may be changed.

As the silicon oxide film 46 is additionally formed, the thickness of the silicon oxide film 46 filled in the gap 42 (i.e. the height H3 from the bottom of the gap 42 to the surface of the silicon oxide film 46) is increased. The thickness of the silicon nitride film 44 additionally deposited in the gap 42 is set to be within the saturation thickness described in FIG. 4B in terms of densification and uniformity of the silicon oxide film 46 formed in the gap 42.

Next, referring to FIGS. 4D and 5, the gap 42 is fully filled with the silicon nitride film 44 having flowability on the exposed surface of the silicon oxide film 46 formed in the gap 42 according to Operation 240. In other words, while supplying a process gas, such as a silicon precursor, a nitrogen reactant gas, and the like, into the reaction space in a plasma atmosphere, the silicon nitride film 44 having flowability is additionally deposited in the gap 42 that is partially filled with the silicon oxide film 46. In this state, the gap 42 is fully filled with the silicon nitride film 44.

Next, the supply of the silicon precursor and the nitrogen reactant gas into reaction space is stopped, and an oxygen-containing gas is supplied into the reaction space, resulting in converting the silicon nitride film 44 fully filling the gap into the silicon oxide film 46 (Operation 250).

Next, referring to FIGS. 4E and 5, a post-treatment is performed for densification of the silicon oxide film 46 formed in the gap 42 according to Operation 250 (Operation 260). As described above, well-known technologies for the densification of the silicon oxide film 46 may be used as the post-treatment. For example, a high temperature heat treatment may be performed.

Figure 6:
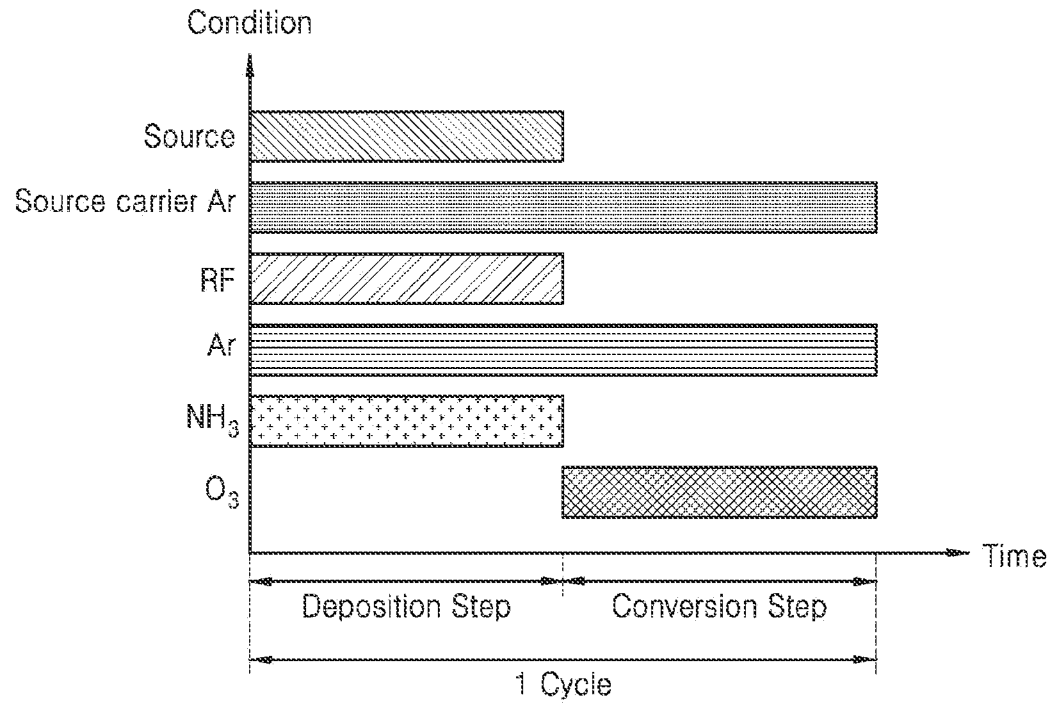
FIG. 6 is a graph showing a process sequence of a process of filling a gap with a silicon oxide film, according to an embodiment of the disclosure.

FIG. 6 is a graph showing a process sequence of a process of filling a gap with a silicon oxide film, according to an embodiment of the disclosure.

Referring to FIG. 6, a gap-fill process of filling a gap with a silicon oxide film according to an embodiment of the disclosure may include a deposition step of depositing a silicon nitride film in a gap and a conversion step of converting the silicon nitride film filled in the gap into a silicon oxide film. The both steps constitute one cycle, and the gap-fill process is performed by repeating the cycle a plurality of times. The deposition step and the conversion step may be performed within the same reaction space, or in separate reaction spaces.

The deposition step is performed by providing a substrate having a gap formed in a surface thereof into a reaction space, supplying a silicon precursor source and a nitrogen reactant gas (e.g. $NH_3$ gas) into the reaction space, and applying RF power to the reaction space to form a plasma atmosphere in the reaction space. As the deposition step proceeds, a silicon nitride film is deposited on an exposed surface of the substrate including gaps. The conversion step is performed by converting the silicon nitride film formed in the deposition step into a silicon oxide film by flowing an oxygen-containing gas. For example, an ozone gas may be used as the oxygen-containing gas, and in another embodiments, an oxygen molecule or oxygen plasma may be used therefor.

In the deposition step, a silicon precursor may be supplied with an argon gas as a carrier gas into the reaction space, and the nitrogen reactant gas may be supplied into the reaction space within a range of more than 0 sccm to several thousand sccm, for example, about 1 sccm to about 2,500 sccm. Furthermore, the temperature of the substrate in the reaction space may be maintained at about 0° C. to about 150° C. Alternatively, the temperature of a silicon precursor container may be maintained at about 0° C. to about 150° C. To from a plasma atmosphere in the reaction space, RF power in a range of more than 0 W to about 500 W may be applied to the reaction space. In this state, a RF frequency may be about 10 MHz to about 60 MHz. The process pressure for depositing the silicon nitride film 44 may be within a range of about 0.5 Torr to about 50.0 Torr. Furthermore, the process time of the deposition step in one cycle may be within a range of several seconds to several hundred seconds, for example, about 5 seconds to about 500 seconds. In an embodiment of the disclosure, an in-situ plasma treatment may be performed in which RF power is applied directly to a reaction chamber while supplying the silicon precursor and the nitrogen reactant gas together into the reaction space, or a remote plasma treatment may be performed in which activated species are generated remotely and transported into the reaction space.

In the conversion step, an oxygen-containing gas such as an ozone gas may be supplied into the reaction space within a range of more than 0 sccm to several thousand sccm. For example, about 1 sccm to about 5,000 sccm of ozone gas may be supplied. Furthermore, the temperature of the substrate in the reaction space may be maintained at about 0° C. to about 150° C., greater than the temperature of the substrate in the deposition step. Furthermore, the pressure in the reaction space may be within a range of about 0.5 Torr to about 50.0 Torr, greater than the pressure in the reaction space in the deposition step. Furthermore, the process time of the conversion step may be greater than the process time of the deposition step within a range of several tens of seconds to several thousand seconds, for example, about 10 seconds to about 2,000 seconds. In some embodiments, a ratio between a process time of the partially filling of the gap with the silicon nitride film and a process time of the forming of the silicon oxide film partially filled in the gap by converting the silicon nitride film into the silicon oxide film may be within a range of about 1:1 to about 1:20. In some embodiments, a ratio between the process time of the first deposition step: the process time of the first conversion step may be within about 1:1 to about 1:20.

Figure 7:
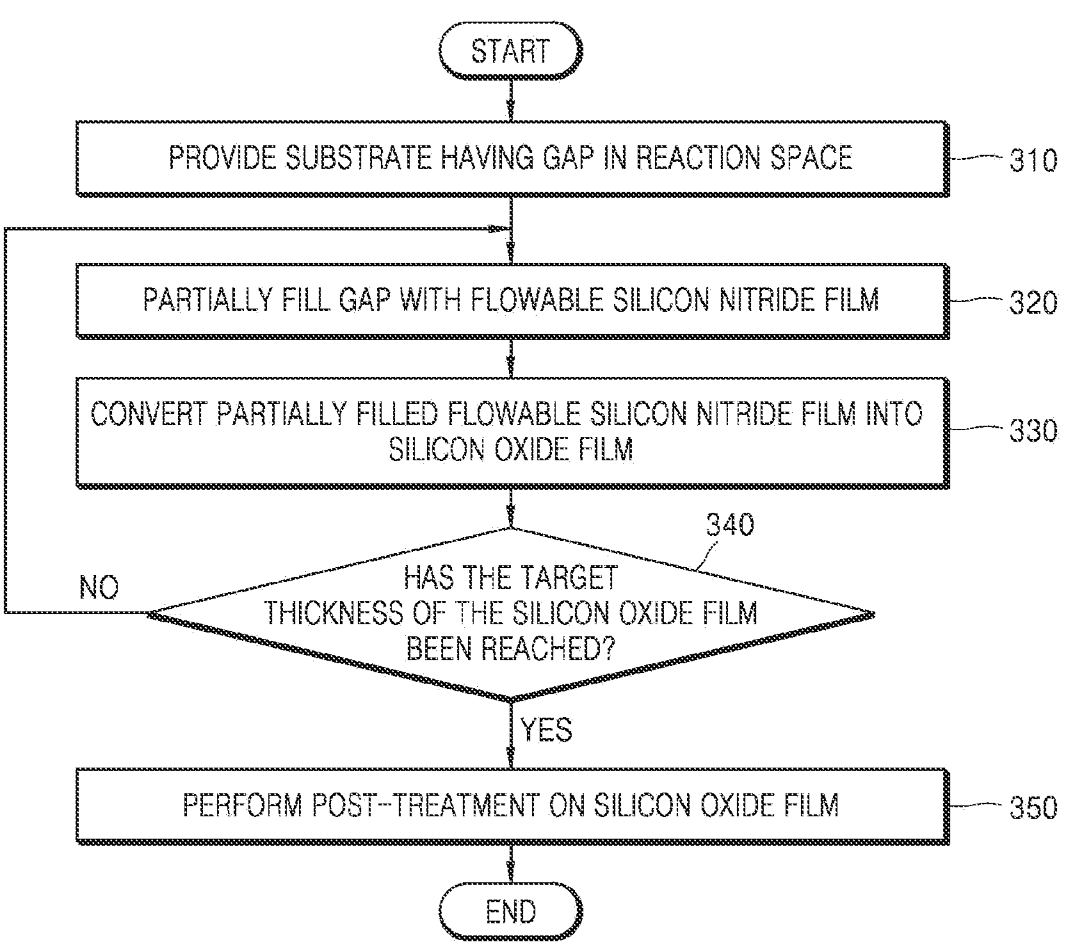
FIG. 7 is a flowchart of a process of filling a gap with a silicon oxide film, according to an embodiment of the disclosure.

FIG. 7 is a flowchart of a process of filling a gap with a silicon oxide film, according to an embodiment of the disclosure. In FIG. 7, a step of partially filling a gap and a conversion step are repeatedly performed before the gap is fully filled, unlike the conventional gap-fill process described in FIG. 2 in which a gap is fully filled with a silicon nitride film at a time and then the silicon nitride film is converted into a silicon oxide film, Referring to FIG. 7 with FIGS. 4A to 4E together, the substrate 40 is provided into a reaction space (Operation 310).

Next, referring to FIG. 7 with FIG. 4B together, the gap 42 formed in the surface of the substrate 40 is partially filled with the silicon nitride film 44 having flowability (Operation 320). In this state, the gap 42 is partially, not fully, filled with the silicon nitride film 44. Next, the supply of the silicon precursor and the nitrogen reactant gas into reaction space is stopped, and an oxygen-containing gas is supplied into the reaction space. Therefore, the silicon nitride film 44 partially filled in the gap 42 is converted into the silicon oxide film 46 (Operation 330).

Next, whether the thickness of the silicon oxide film 46 partially filled in the gap 42 has reached a preset target thickness is determined (Operation 340). In the embodiment of FIG. 7, the target thickness may correspond to the thickness of the silicon oxide film 46 when the silicon oxide film 46 is fully filled up to the top surface of the gap 42. In this case, the target thickness may correspond to the depth of the gap 42. The target thickness may be set based on the silicon oxide film, but may be set based on the silicon nitride film before converted into the silicon oxide film.

However, Operation 340 is an optional step. Thus, in an alternative embodiment to the embodiment illustrated in FIG. 7, whether to repeatedly or further perform Operation 320 and Operation 330 may be determined not based on whether the target thickness of the silicon oxide film has been reached, but by previously setting the number of repetitions of Operation 320 and Operation 330, and then detecting whether the preset number of repetitions has been reached. In another embodiment, whether to repeatedly or further perform Operation 320 and Operation 330 may be determined by previously setting process times of Operation 320 and Operation 330, and then detecting whether the preset process times have been reached.

In Operation 340, when the thickness of the silicon oxide film 46 or the thickness of the silicon nitride film 44 filled in the gap 42 has not reached the preset target thickness (NO), Operation 320 and Operation 330 are repeatedly performed.

When the thickness of the silicon oxide film 46 or the thickness of the silicon nitride film 44 filled in the gap 42 has reached the preset target thickness (YES), as illustrated in FIG. 4E, a post-processing process is performed on the silicon oxide film 46 (Operation 350).

Figure 8:
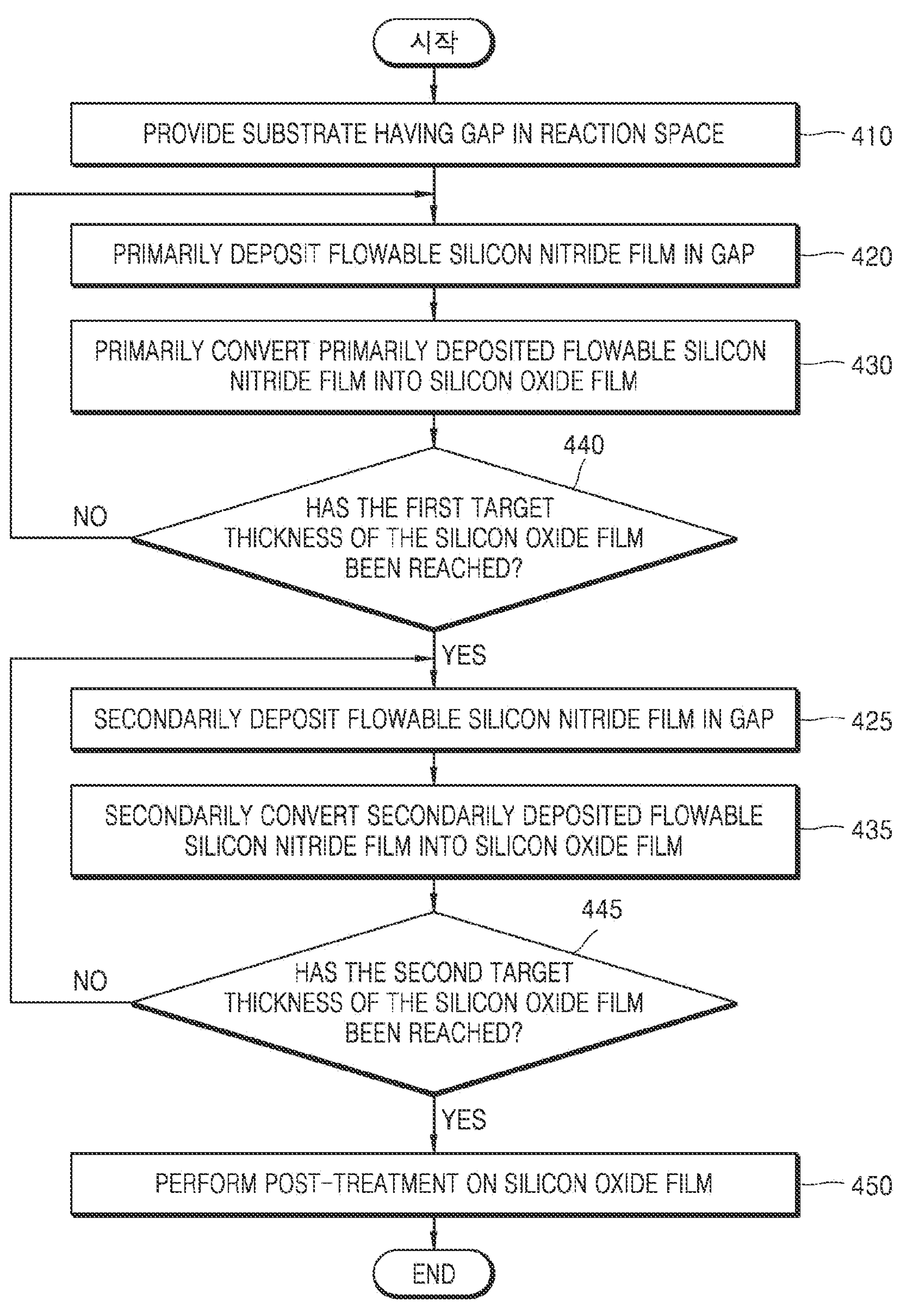
FIG. 8 is a flowchart of a process of filling a gap with a silicon oxide film, according to another embodiment of the disclosure.

FIG. 8 is a flowchart of a process of filling a gap with a silicon oxide film, according to another embodiment of the disclosure. The embodiment of FIG. 8 relates to a case in which, before a gap is fully filled with a silicon nitride film, partial filling (or primary deposition)/conversion (or primary conversion) of the gap and partial filling (or secondary deposition)/conversion (or secondary conversion) of the gap are repeatedly performed a plurality of times. The process illustrated in FIG. 8 may be applicable to a case in which a target thickness of the silicon oxide film is changed during the gap fill process.

Referring to FIG. 8 with FIGS. 4A to 4E together, the substrate 40 is provided to a reaction space. (Operation 410).

Next, referring to FIG. 8 with FIG. 4B together, the silicon nitride film 44 is primarily deposited to partially fill the gap 42 formed in the surface of the substrate 40 with the silicon nitride film 44 having flowability (Operation 420). In this state, the gap 42 is partially, not fully, filled with the silicon nitride film 44. Next, the supply of the silicon precursor and the nitrogen reactant gas into reaction space in stopped, and an oxygen-containing gas is supplied into the reaction space. Therefore the silicon nitride film 44 which is primarily and partially filled in the gap 42 is primarily converted into the silicon oxide film 46 (Operation 430).

Next, whether the silicon oxide film 46 partially filled in the gap 42 has reached a preset primary target thickness is determined (Operation 440). In the embodiment of FIG. 8, the primary target thickness may correspond to the saturation thickness described above in FIG. 4B. Accordingly, the primary target thickness may be set to be the same as or less than the saturation thickness of the silicon oxide film in terms of densification and uniformity. Although the target thickness is set based on the silicon oxide film, the target thickness may be set based on the silicon nitride film before being converted into the silicon oxide film.

However, Operation 440 is an optional step. Thus, in an alternative embodiment to the embodiment illustrated in FIG. 8, whether to repeatedly or further perform Operation 420 and Operation 430 may be determined not based on whether the primary target thickness of the silicon oxide film has been reached, but by previously setting the number of repetitions of Operation 420 and Operation 430, and then detecting whether the preset number of repetitions has been reached, and in another embodiment, whether to repeatedly perform Operation 420 and Operation 430 may be determined by previously setting process times of Operation 420 and Operation 430, and then detecting whether the preset process times have been reached.

When the primary target thickness of the silicon oxide film has not been reached (NO), Operation 420 and Operation 430 are repeatedly performed, and when the primary target thickness of the silicon oxide film has been reached (YES), the gap-fill process performs a secondary deposition of depositing a gap with a flowable silicon nitride film (Operation 425) and a secondary conversion of converting the silicon nitride film that is secondarily deposited into a silicon oxide film (Operation 435).

Next, after Operation 425 and Operation 435 proceed, whether a secondary target thickness of the silicon oxide film has been reached is determined (Operation 445). In the embodiment of FIG. 8, the secondary target thickness may correspond to the thickness of the silicon oxide film 46 when the silicon oxide film 46 is fully filled up to the top surface of the gap 42. In this case, the secondary target thickness may be a thickness corresponding to the depth of the gap 42. According to the method of setting the secondary target thickness, the secondary target thickness may be set to be a value obtained by subtracting the primary target thickness from the depth of the gap 42. Although the secondary target thickness may be set based on the silicon oxide film, the target thickness may be set based on the silicon nitride film before being converted into the silicon oxide film.

However, Operation 445 is an optional step. Thus, in an alternative embodiment to the embodiment illustrated in FIG. 8, whether to repeatedly or further perform Operation 425 and Operation 435 may be determined not based on whether the secondary target thickness of the silicon oxide film has been reached, but by previously setting the number of repetitions of Operation 425 and Operation 435, and then detecting whether the preset number of repetitions has been reached, or by previously setting process times of Operation 425 and Operation 435, and then detecting whether the preset process times have been reached.

When the thickness of the silicon oxide film 46 filled in the gap 42 or the silicon nitride film 44 has reached the preset secondary target thickness (YES), as illustrated in FIG. 4E, a post-treatment is performed on the silicon oxide film 46 (Operation 450).

Figure 9:
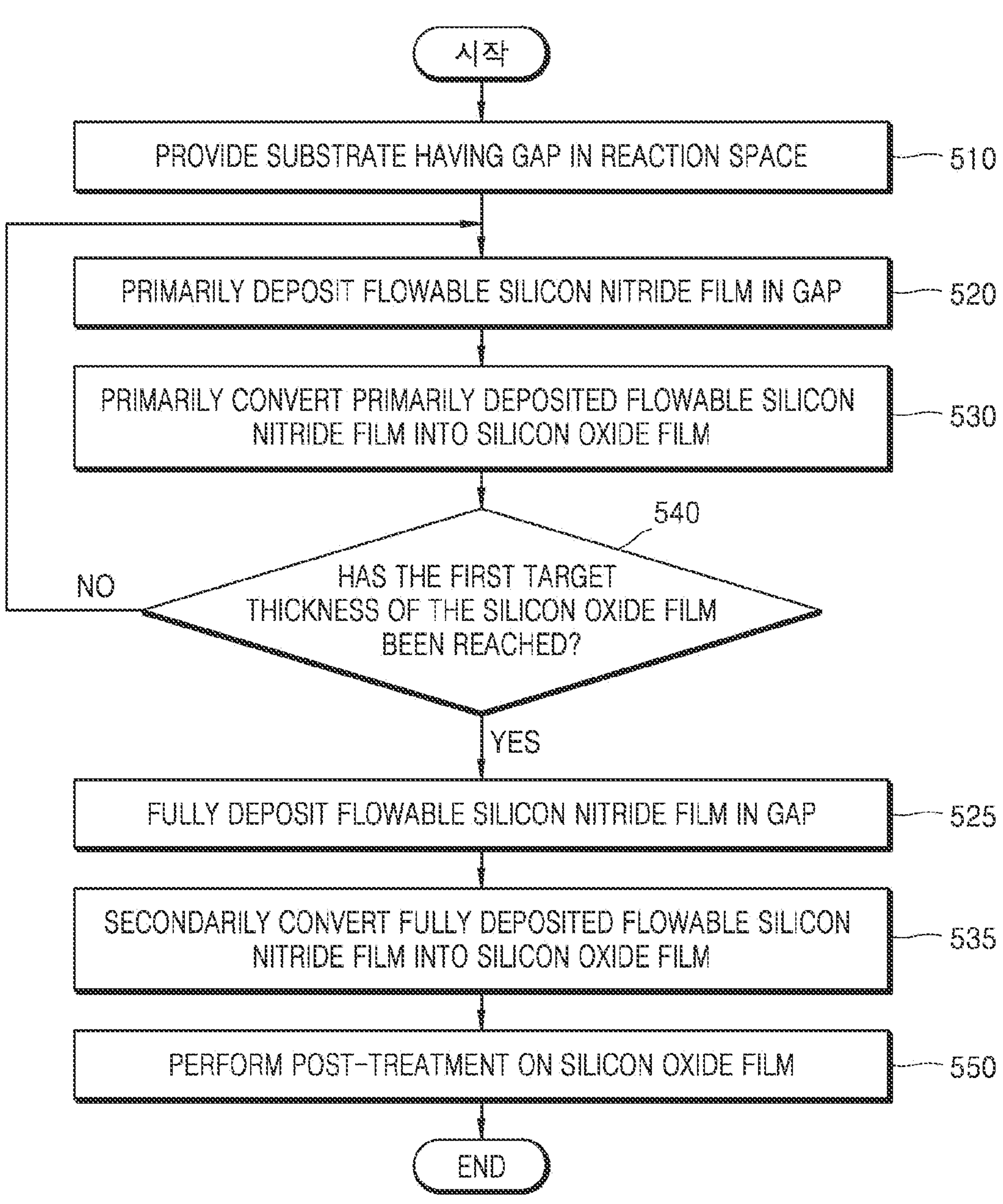
FIG. 9 is a flowchart of a process of filling a gap with a silicon oxide film, according to another embodiment of the disclosure.

FIG. 9 is a flowchart of a process of filling a gap with a silicon oxide film, according to another embodiment of the disclosure. The embodiment of FIG. 9 relates to a case in which the primary filling step and the primary conversion step are repeatedly perform up to the primary target thickness of the silicon oxide film, and after the primary target thickness is reached, a portion of a gap that is not filled is fully filled with the silicon nitride film as illustrated in FIG. 2, and then, the secondary conversion into the silicon oxide film is performed.

Referring to FIG. 9 with FIGS. 4A to 4E together, the substrate 40 is provided to a reaction space. (Operation 510).

Next, referring to FIG. 9 with FIG. 4B together, the gap 42 formed in the surface of the substrate 40 is primarily filled with the silicon nitride film 44 having flowability (Operation 520). In this state, the gap 42 is partially, not fully, filled with the silicon nitride film 44. Next, the silicon nitride film 44 that is primarily and partially filled in the gap 42 is primarily converted into the silicon oxide film 46 (Operation 530).

Next, whether the silicon oxide film 46 partially filled in the gap 42 has reached a preset primary target thickness is determined (Operation 540). In the embodiment of FIG. 9, the primary target thickness may correspond to the saturation thickness described above in FIG. 4B. Accordingly, the primary target thickness may be set to be the same as or less than the saturation thickness of the silicon oxide film in terms of densification and uniformity. Although the target thickness is set based on the silicon oxide film, the target thickness may be set based on the silicon nitride film before being converted into the silicon oxide film.

However, Operation 540 is an optional step. Thus, in an alternative embodiment to the embodiment illustrated in FIG. 9, whether to repeatedly or further perform Operation 520 and Operation 530 may be determined not based on whether the primary target thickness of the silicon oxide film has been reached, but by previously setting the number of repetitions of Operation 520 and Operation 530, and then detecting whether the preset number of repetitions has been reached, and in another embodiment, whether to repeatedly perform Operation 520 and Operation 530 may be determined by previously setting process times of Operation 520 and Operation 530, and then detecting whether the preset process times have been reached.

When the primary target thickness of the silicon oxide film has not been reached (NO), Operation 520 and Operation 530 are repeatedly performed, and when the primary target thickness of the silicon oxide film has been reached (YES), the gap-fill process performs fully depositing the gap with flowable silicon nitride film (Operation 525) and a secondary conversion of converting the flowable silicon nitride film that is fully deposited into the silicon oxide film (Operation 535).

Next, a post-treatment is performed on the silicon oxide film 46 filled in the gap 42 (Operation 550).

Figure 10:
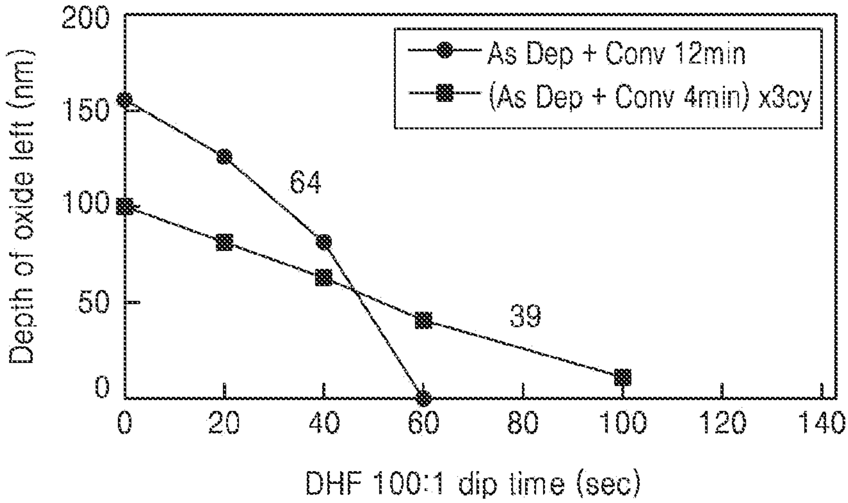
FIG. 10 is a graph showing wet etching rate ratios (WERR) of a silicon oxide film formed according to the related art and a silicon oxide film formed according to an embodiment of the disclosure.

FIG. 10 is a graph showing a comparison of wet etching rate ratios (WERR) of a silicon oxide film formed according to the related art and a silicon oxide film formed according to an embodiment of the disclosure.

WERR may denote a degree of the densification of a film, and is defined as a ratio of an etch rate WER2 of a film subject to comparison (e.g. an etch rate of a silicon oxide film formed according to an embodiment of the disclosure), compared with an etch rate WER1 of a silicon oxide film formed by a thermal process at 1100° C. under an oxygen or vapor atmosphere. Furthermore, the etch rate is calculated by immersing a substrate on which a silicon oxide film subject to measurement is formed in a diluted hydrofluoric acid (dHF) aqueous etching solution at a ratio of 1:100 for a certain time, for example, 60 seconds, and then, measuring a film thickness etched by the hydrofluoric acid aqueous solution.

Referring to FIG. 10, the silicon oxide film formed according to the related art (marked by a black circle) is a sample obtained by depositing a silicon nitride film on a substrate according to the related art of FIG. 2 and then performing the conversion step into the silicon oxide film for 12 minutes, and the silicon oxide film formed according to an embodiment of the disclosure (marked by a black rectangle) is a sample obtained by performing a cycle three times, the cycle including partially depositing a silicon nitride film on a substrate and then performing the conversion step into the silicon oxide film for 4 minutes.

FIG. 10 shows a thickness of a remaining silicon oxide film according to the etching time. The sample silicon oxide films are deposited according to the related art and the disclosure respectively, and immersed and etched in a diluted hydrofluoric acid (dHF) aqueous solution diluted at a ratio of 1:100 for a certain time, for example, 0, 20, 40, 60, 80, and 100 seconds. As can be seen from the graph of FIG. 10, in case of the silicon oxide film having a 150 nm thickness (corresponding to 0 seconds) deposited by the related art, it may be seen that a wet etch rate (i.e. depth of oxide left per unit time) is very high and the inclination of a graph is very sharp such that there is almost no remaining silicon oxide film after 60 seconds in dipping time, which means that the densification of the silicon oxide film according to the related art is very low and the film quality of an upper region and a lower region of the film is not the same.

In contrast, in case of the silicon oxide film according to the disclosure, when the silicon oxide film having a 100 nm thickness (corresponding to 0 seconds) is immersed for 60 seconds, a remaining silicon oxide film has a thickness of about 50 nm, and a silicon oxide film still remains even being immersed in the etching solution for 100 seconds, and thus, it may be seen that the silicon oxide film according to the disclosure has a low wet etch rate and an almost linear and very gentle inclination of a graph, compared to the silicon oxide film according to the related art, which means that the densification of the silicon oxide film according to the disclosure is high compared with silicon oxide film according to the related art, and means that the film quality of the upper region and the lower region of the film is more uniform than that of the related art.

Furthermore, it may be seen that, in the related-art case, the depth of remaining silicon oxide film over the etching time (e.g. dipping time) sharply decreases in the form of a secondary function so that the uniformity of a silicon oxide film is not good (e.g. film composition, density etc.), but in contrast, in the case according to the disclosure, the depth of a remaining silicon oxide film over the etching time (e.g. dipping time) gently decreases in the form of about a primary function so that the uniformity of a silicon oxide film(e.g. in film composition, density etc.) is very good. These results also mean that the conversion has been sufficiently made from the surface of a silicon oxide film to a very deep position.

Figure 11:
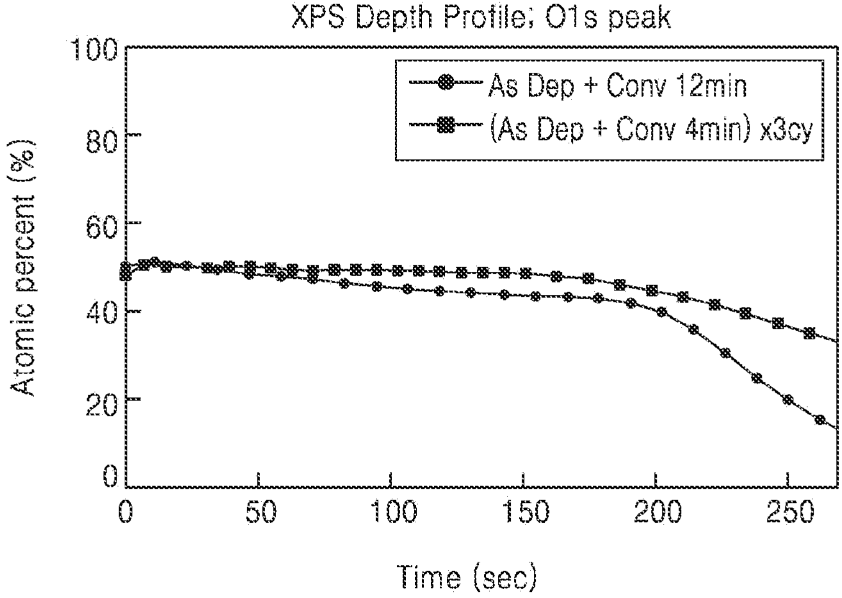
FIG. 11 is a graph showing a depth profile by X-ray photoelectron spectrometry (XPS) with respect to a silicon oxide film formed according to the related art and a silicon oxide film formed according to an embodiment of the disclosure.

FIG. 11 is a graph showing a comparison of a depth profile by X-ray photoelectron spectrometry (XPS) with respect to a silicon oxide film formed according to the related art and a silicon oxide film formed according to an embodiment of the disclosure. Samples used in FIG. 11 are the same as those identically formed in FIG. 10.

As can be seen from the graph of FIG. 11, in the case of a silicon oxide film formed according to the related art (black circle), oxygen atom concentration gradually decreases over time, that is, according to the depth from the surface of a film, and then sharply decreases in the vicinity of about 200 seconds. In contrast, in the case of a silicon oxide film formed according to an embodiment of the disclosure (black rectangle), oxygen atom concentration is maintained almost constant over time to the vicinity of about 200 seconds, and gradually decrease after the vicinity of about 200 seconds. It may be seen from the above result that, compared with the silicon oxide film according to the related art, the densification and uniformity of the silicon oxide film according to the disclosure are very high such that the oxygen atom concentration is maintained constant from the surface of film to a very deep position. These results also mean that the conversion has been sufficiently made from the surface of a silicon oxide film to a very deep position and the film quality is uniform (e.g. in film composition and density etc.).

Figure 12:
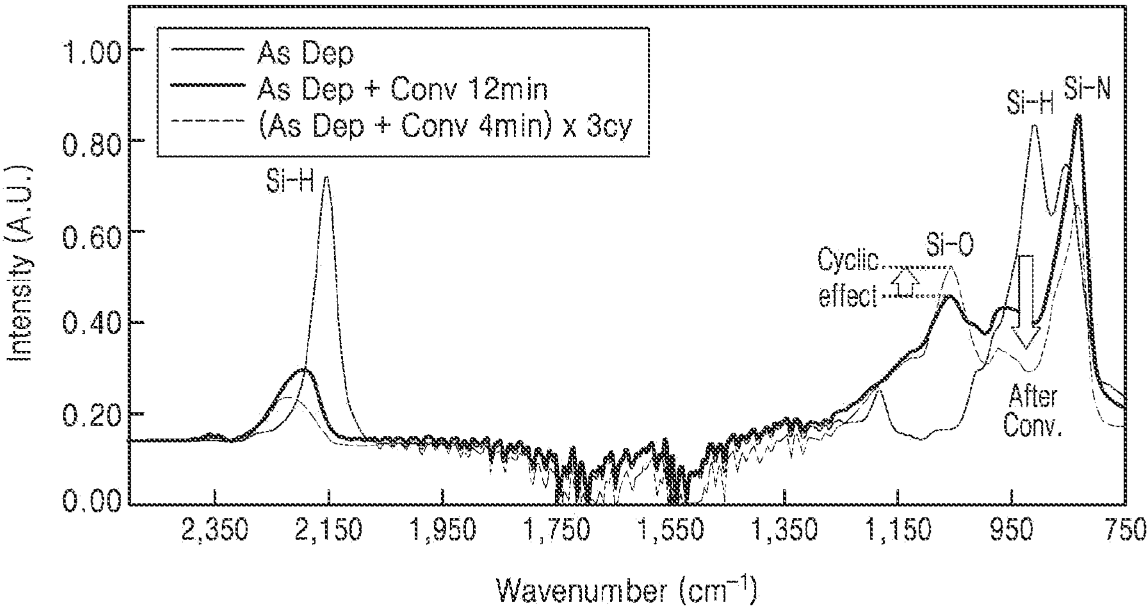
FIG. 12 is a graph showing a Fourier transform infrared spectroscopy (FT-IR) of a silicon oxide film formed according to the related art and a silicon oxide film formed according to an embodiment of the disclosure.

FIG. 12 is a graph showing a comparison of Fourier transform infrared spectroscopy (FT-IR) of a silicon oxide film formed according to the related art and a silicon oxide film formed according to an embodiment of the disclosure. FIG. 12 shows experimental results of Sample 1 (a thin solid line), in which only a deposition step of depositing a silicon oxide film is performed, Sample 2 (a thick solid line) of a silicon oxide film formed according to the related art of FIG. 2, in which a silicon nitride film is deposited on a substrate at a time, and then, a conversion step of converting into a silicon oxide film is performed for 12 minutes, and a Sample 3 (a dotted line) of a silicon oxide film formed according to an embodiment of the disclosure, in which a cycle of partially depositing a silicon nitride film on a substrate and then performing a conversion step of converting into a silicon oxide film for 4 minutes is performed three times.

Referring to FIG. 12, it may be seen that, in Sample 3 according to the disclosure, compared with Sample 2 according to the related art, the Si—O bonding peak increases, but peaks of Si—H bonding and Si—N bonding decrease. These results also mean that the degrees of film formation and densification of the silicon oxide film according to the disclosure is very higher than that of the silicon oxide film according to the related art.

Figure 13A:
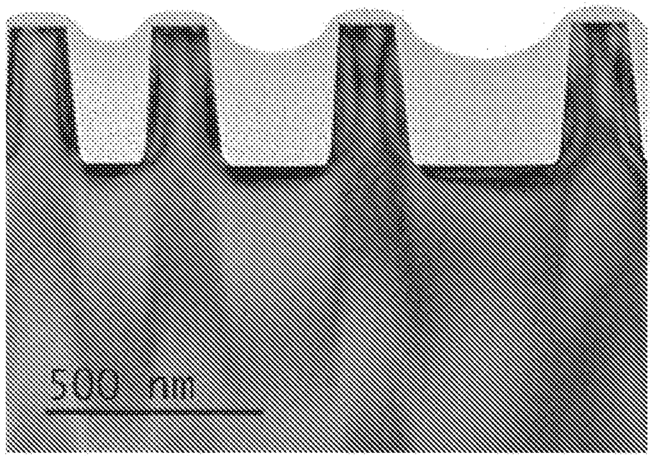
FIGS. 13A and 13B are transmission electron microscope (TEM) images of a silicon oxide film formed according to the related art and a silicon oxide film formed according to an embodiment of the disclosure, respectively.
Figure 13B:
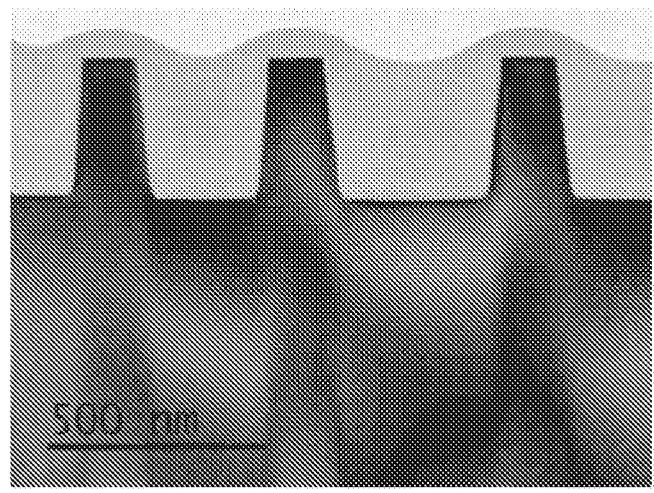

FIGS. 13A and 13B are transmission electron microscope (TEM) images of a silicon oxide film formed according to the related art and a silicon oxide film formed according to an embodiment of the disclosure, respectively. FIG. 13A shows an experimental result of a sample of a silicon oxide film formed in a gap according to the related art of FIG. 2, in which a silicon nitride film is deposited at a time on a substrate having gaps formed therein, and then, a conversion step of converting into a silicon oxide film is performed for 12 minutes, and FIG. 13B shows an experimental result of a sample of a silicon oxide film formed in a gap according to an embodiment of the disclosure, in which a cycle of partially depositing a silicon nitride film on a substrate having gaps formed therein and then performing a conversion step of converting into a silicon oxide film for 4 minutes is performed three times.

As can be seen from the image of FIG. 13A, in the silicon oxide film formed according to the related art, a lot of micro-pores are generated in a lower region of a gap (or trench), and in particular it can be seen that the closer to the bottom of a gap, the more micro-pores are generated. In contrast, as can be seen from the image of FIG. 13B, in the silicon oxide film formed according to the disclosure, no micro-pore is generated not only in the upper region of a gap, but also in the lower region thereof.

It can be seen from these results that, in the silicon oxide film formed according to the disclosure, the conversion into a silicon oxide film is sufficiently made to a very deep position or the lower region of a gap of the silicon oxide film, and thus, the densification and uniformity of a film are improved very much.

Figure 14:
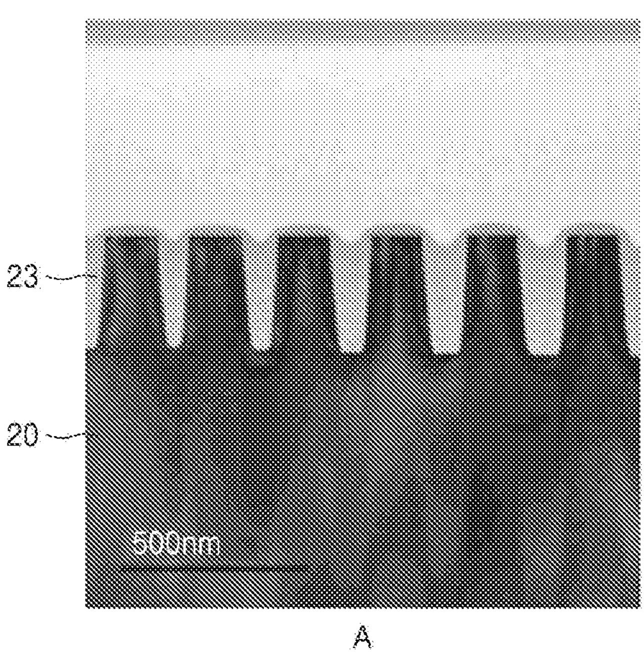
FIG. 14 is a cross-sectional image taken by TEM showing the effect of suppressing or eliminating the occurrence of micropores in the silicon oxide film filling the gaps having a high aspect ratio and the delamination of the silicon oxide film in the substrate processing method according to an embodiment of the disclosure.
Figure 14:
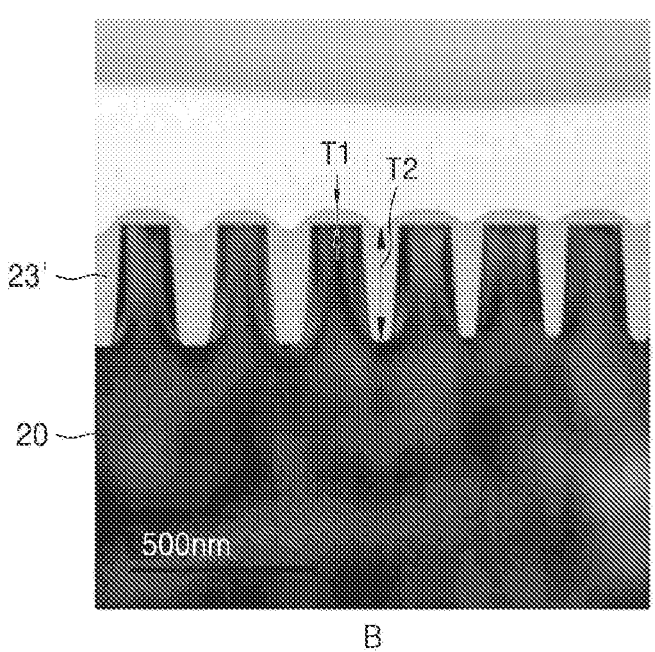

FIG. 14 is a cross-sectional image taken by transmission electron microscopy showing the effect of removing or at least suppressing micropores generated in the silicon oxide film filling the gaps having a high aspect ratio and the phenomenon of delamination of the silicon oxide film in the substrate processing method according to an embodiment of the disclosure. Referring to the upper portion (A) of FIG. 14, the silicon nitride film 23 covering the entire surface of the substrate 20 is deposited on the substrate 20 having gaps formed therein by a PECVD process. At this time, due to the capillary condensation effect, the gap-fill process may proceed in such a manner that gaps having narrow critical dimension (CD) are first filled with oligomers or the like prior to filling the gaps having wide CD, and the silicon nitride film 23 is deposited to make the maximum thickness T1 formed on the top portion of the convex between gaps be about 11% or less of the maximum thickness T2 filled in the gap, and unlike a conventional gap-fill process, the conversion process into a silicon oxide film may be performed in such a state that an additional silicon nitride film is not deposited any more.

The lower portion (B) of FIG. 14 shows a state in which the silicon nitride film 23 is converted into the silicon oxide film 23' by a conversion process in the state described above. Referring to the lower portion (B) of FIG. 14, it can be seen that almost no micropores are formed in the silicon oxide film 23' filling the gaps. In addition, it can be confirmed that the portion in which the silicon oxide film 23' filling the gaps is delaminated from the substrate 20, is not present. Therefore, in the substrate processing method according to an embodiment of the disclosure, the formation of micropores and the delamination phenomenon may be removed or at least suppressed so that the technical effect of filling the gaps formed in the surface of the substrate with the silicon oxide film with improved density and uniformity can be obtained. Without intending to be bound by any particular theory, this may be due to the fact that, in the conversion process into the silicon oxide film, the silicon nitride film is thin so that oxygen radicals may easily permeate into the film and byproduct gases, which may be generated during the conversion process, may be easily released therefrom.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:

providing a substrate having a gap in a surface thereof into a reaction space;

partially filling the gap with a flowable first silicon nitride film;

forming a first silicon oxide film partially filled in the gap by converting the first silicon nitride film into the first silicon oxide film;

fully filling the gap, which is partially filled with the first silicon oxide film, with a second silicon nitride film; and forming a second silicon oxide film, by converting the second silicon nitride film into the second silicon oxide film, wherein the gap is fully filled after forming the second silicon oxide film.

2. The substrate processing method of claim 1, wherein the second silicon nitride film comprises a maximum thickness T1 on a top portion of a convex between the gap and an adjacent gap and a thickness T2 in the gap, wherein Tl is 25% or less of T2.

3. The substrate processing method of claim 1, further comprising forming an additional silicon oxide film over the entire surface of the second silicon oxide film.

4. The substrate processing method of claim 1, further comprising performing a post-treatment of densifying the second silicon oxide film.

5. The substrate processing method of claim 1, wherein the first silicon nitride film fills up to half of a depth of the gap.

6. The substrate processing method of claim 1, wherein, when a thickness at which the conversion into the first silicon oxide film from a surface of the first silicon nitride film is saturated over a process time is defined as a saturation thickness, a thickness of the first silicon nitride film is within the saturation thickness.

7. The substrate processing method of claim 1, wherein forming the first or second silicon nitride film is performed by supplying a silicon precursor and a nitrogen reactant gas into the reaction space and maintaining the reaction space in a plasma atmosphere.

8. The substrate processing method of claim 7, wherein the silicon precursor comprises at least one of an aminosilane, or a silicon-containing oligomer.

9. The substrate processing method of claim 7, wherein the silicon precursor comprises at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; dimer-trisilylamine, trimer-trisilylamine, tetramer-trisilylamine, pentamer-trisilylamine, hexamer-trisilylamine, heptamer-trisilylamine, and octamer-trisilylamine, or any mixtures thereof.

10. The substrate processing method of claim 7, wherein the nitrogen reactant gas comprises at least one selected from $NH_3$, $N_2$, $N_2O$, $NO_2$, $N_2H_2$, $N_2H_4$, and any mixtures thereof.

11. The substrate processing method of claim 1, wherein the converting of the first silicon nitride film into the first silicon oxide film is performed by flowing an oxygen-containing gas in the reaction space.

12. The substrate processing method of claim 11, wherein the oxygen-containing gas comprises at least one of an $O_3$ gas and an oxygen radical.

13. The substrate processing method of claim 1, wherein converting the first silicon nitride film into the first silicon oxide film is performed in the reaction space in a non-plasma atmosphere.

14. The substrate processing method of claim 1, wherein forming the first silicon nitride film and forming the second silicon nitride film are performed under the same process condition.

15. The substrate processing method of claim 1, wherein a ratio between a process time of forming the first silicon nitride film and a process time of the forming of the first silicon oxide film is within a range of about 1:1 to about 1:20.

16. The method of claim 3, wherein the step of forming the additional silicon oxide film is performed by a chemical vapor deposition (CVD) process or an atomic layer deposition (ALD) process.

17. A substrate processing method comprising:

providing a substrate having a gap in a surface thereof into a reaction space;

performing a first deposition step of depositing the gap with a flowable first silicon nitride film;

performing a first conversion step of converting the first silicon nitride film that is deposited in the gap into a first silicon oxide film;

performing a second deposition step of depositing a flowable second silicon nitride film on the first silicon oxide film in the gap; and performing a second conversion step of converting the second silicon nitride film in the gap into a second silicon oxide film.

18. The substrate processing method of claim 17, the second deposition step is controlled such that a maximum thickness T1 of the first silicon nitride film formed on a top portion of a convex between the gap and an adjacent gap is 25% or less of a maximum thickness T2 of the first silicon nitride film filling the gap.

19. The substrate processing method of claim 17, further comprising forming an additional silicon oxide film over the entire surface of the second silicon oxide film.

20. The substrate processing method of claim 17, further comprising, after the second conversion step, performing a post-treatment of densifying the second silicon oxide film.

21. The substrate processing method of claim 17, wherein the first deposition step and the first conversion step are each performed twice or more; or a preset process time.

22. The substrate processing method of claim 17, wherein, when a thickness at which the conversion into the first silicon oxide film from the surface of the first silicon nitride film is saturated over the process time is defined as a saturation thickness, a thickness of the first silicon nitride film is within the saturation thickness.

23. The substrate processing method of claim 17, wherein the first conversion step and the second conversion step are each performed in a non-plasma atmosphere, while flowing an oxygen containing gas in the reaction space.

* * * * *